US012648151B2

(12) United States Patent
Lee

(10) Patent No.: US 12,648,151 B2
(45) Date of Patent: Jun. 2, 2026

(54) SEMICONDUCTOR MEMORY DEVICE WITH BARRIER LAYERS BETWEEN GAP-FILL PATTERNS AND METHOD OF MANUFACTURING THE SAME

(71) Applicant: SK hynix Inc., Icheon (KR)

(72) Inventor: Woo Tae Lee, Icheon (KR)

(73) Assignee: SK hynix Inc., Icheon (KR)

( * ) Notice: Subject to any disclaimer, the term of this patent is extended or adjusted under 35 U.S.C. 154(b) by 449 days.

(21) Appl. No.: 18/299,683

(22) Filed: Apr. 12, 2023

(65) Prior Publication Data

US 2024/0015990 A1 Jan. 11, 2024

(30) Foreign Application Priority Data

Nov. 10, 2022 (KR) ........................ 10-2022-0149176

(51) Int. Cl.
*H10B 63/00* (2023.01)
*H10B 63/10* (2023.01)

(52) U.S. Cl.
CPC ............. *H10B 63/80* (2023.02); *H10B 63/10* (2023.02)

(58) Field of Classification Search
CPC ........ H10B 63/84; H10B 63/80; H10B 63/10; H10B 63/20; H10B 63/845; H10B 63/34;

H10B 63/30; H10N 70/011; H10N 70/066; H10N 70/826; H10N 70/882; H10N 70/881; H10N 70/823; H10N 70/20; H10N 70/8833

See application file for complete search history.

(56) References Cited

U.S. PATENT DOCUMENTS

| | | | |
|---|---|---|---|
| 2018/0286920 A1* | 10/2018 | Wicklein | ............. H10B 63/845 |
| 2021/0296329 A1* | 9/2021 | Kim | ...................... H10B 53/50 |
| 2022/0102631 A1 | 3/2022 | Chung et al. | |

FOREIGN PATENT DOCUMENTS

KR 1020210116955 A 9/2021

* cited by examiner

*Primary Examiner* — John P. Dulka

(57) ABSTRACT

A semiconductor device may include: memory cells arranged in a first direction and a second direction intersecting the first direction; first capping patterns extending in the first direction and covering first sidewalls of the memory cells; second capping patterns extending in the second direction and covering second sidewalls of the memory cells; first gap-fill patterns each located between the second capping patterns adjacent in the first direction; second gap-fill patterns each located between the first gap-fill patterns adjacent in the second direction; and barrier layers each located between the second gap-fill patterns.

20 Claims, 29 Drawing Sheets

313A 311A 320A
341A
343A
330A

350A 360
370A

II
I

420C

443

441

413A

411A

420A

420C 460  470A 420C
443A
441A 413A
411A
420A

420B

420C

SEMICONDUCTOR MEMORY DEVICE WITH BARRIER LAYERS BETWEEN GAP-FILL PATTERNS AND METHOD OF MANUFACTURING THE SAME

CROSS-REFERENCE TO RELATED APPLICATION

This application claims priority under 35 U.S.C. § 119 to Korean Patent Application No. 10-2022-0149176 filed on Nov. 10, 2022, which is incorporated herein by reference in its entirety.

BACKGROUND

1. Technical Field

Embodiments of the present disclosure relate to an electronic device and a method of manufacturing the same, and more particularly, to a semiconductor device and a method of manufacturing the same.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a semiconductor device may include: memory cells arranged in a first direction and a second direction intersecting the first direction; first capping patterns extending in the first direction and covering first sidewalls of the memory cells; second capping patterns extending in the second direction and covering second sidewalls of the memory cells; first gap-fill patterns each located between the second capping patterns adjacent in the first direction; second gap-fill patterns each located between the first gap-fill patterns adjacent in the second direction; and barrier layers each located between the second gap-fill patterns.

In an embodiment, a method of manufacturing a semiconductor device may include: forming memory cells arranged in a first direction and a second direction intersecting the first direction; forming capping layers covering sidewalls of the memory cells arranged in the second direction and extending in the second direction; forming each of first gap-fill layers between the memory cells adjacent in the first direction; forming openings that pass through the first gap-fill layers and cut the capping layers between the memory cells adjacent in the second direction; and forming barrier layers in the openings, respectively.

DETAILED DESCRIPTION

Various embodiments are directed to a semiconductor device having a stable structure and improved characteristics and a manufacturing method thereof.

According to the present technology, it is possible to provide a semiconductor device having a stable structure and improved reliability.

Hereafter, embodiments in accordance with the technical spirit of the present disclosure will be described with reference to the accompanying drawings.

Figure 1A:
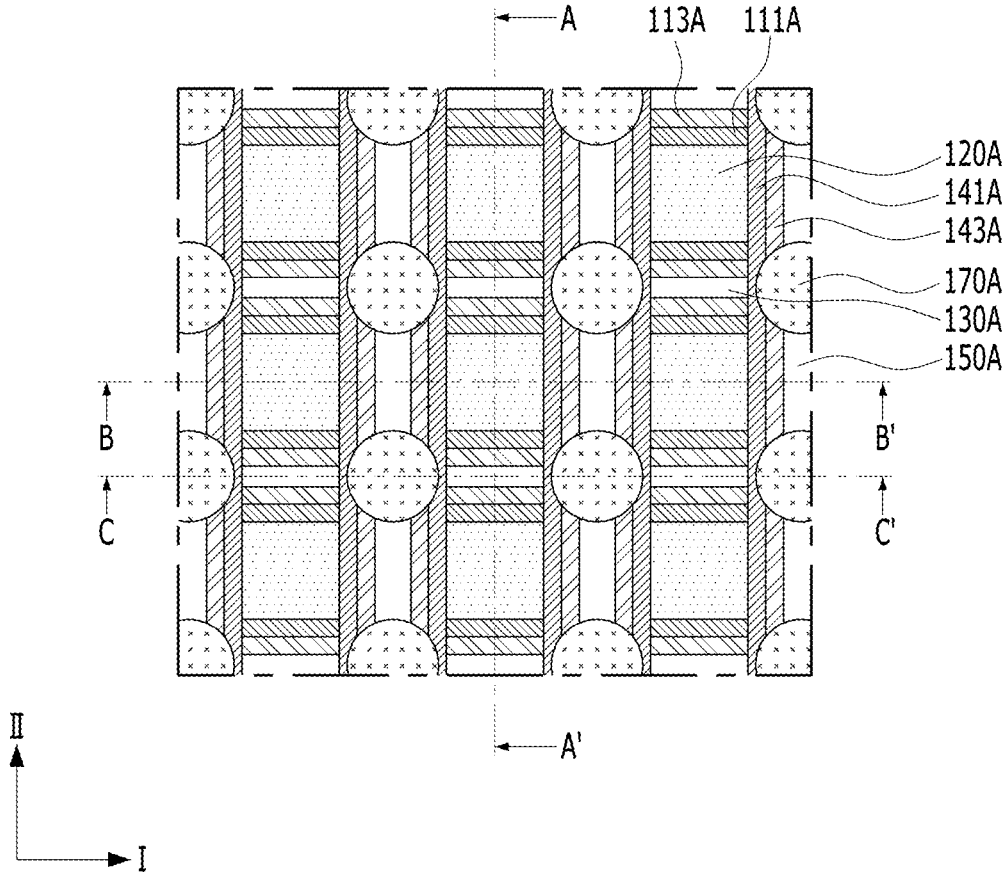
FIGS. 1A, 1B, 1C, 1D, 1E, and 1F are diagrams for describing a semiconductor device in accordance with an embodiment.

FIG. 1A to FIG. 1F are diagrams for describing a semiconductor device in accordance with an embodiment. FIG. 1A may be a plan view, FIG. 1B may be a cross-sectional view taken along line A-A' in FIG. 1A, FIG. 1C may be a cross-sectional view taken along line B-B' in FIG. 1A, FIG. 1D may be a cross-sectional view taken along line C-C' in FIG. 1A, FIG. 1E may be an enlarged view of region D in FIG. 1D according to an embodiment, and FIG. 1F may be an enlarged view of a region corresponding to the region D in FIG. 1D according to another embodiment.

Figure 1B:
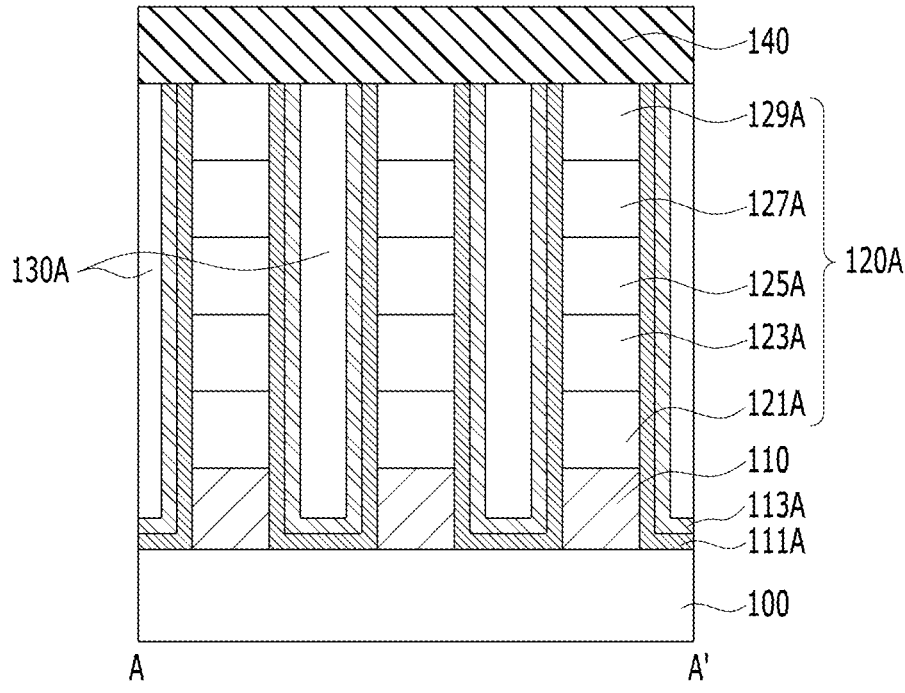
Figure 1C:
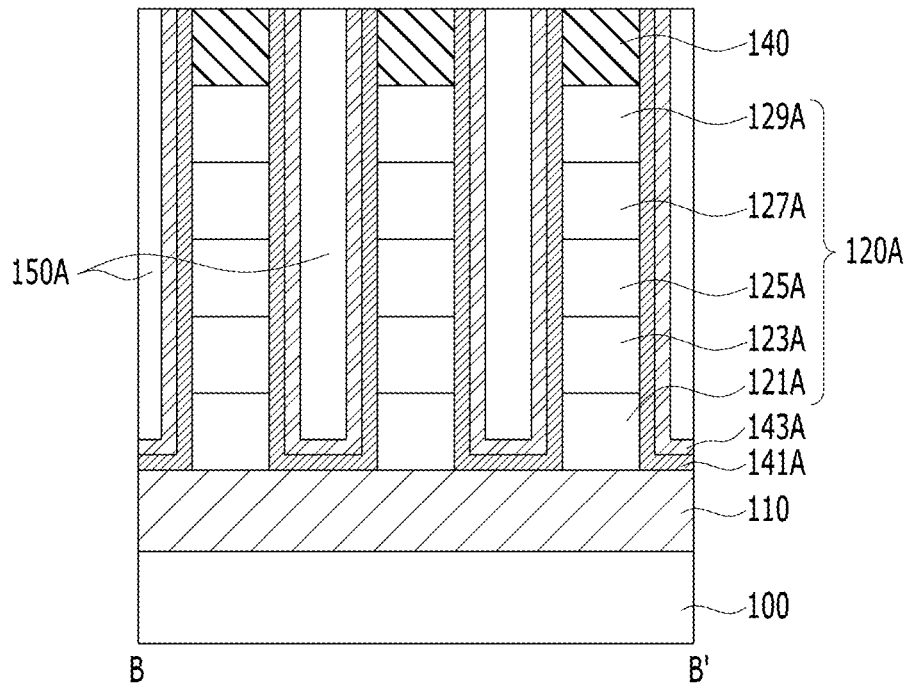
Figure 1D:
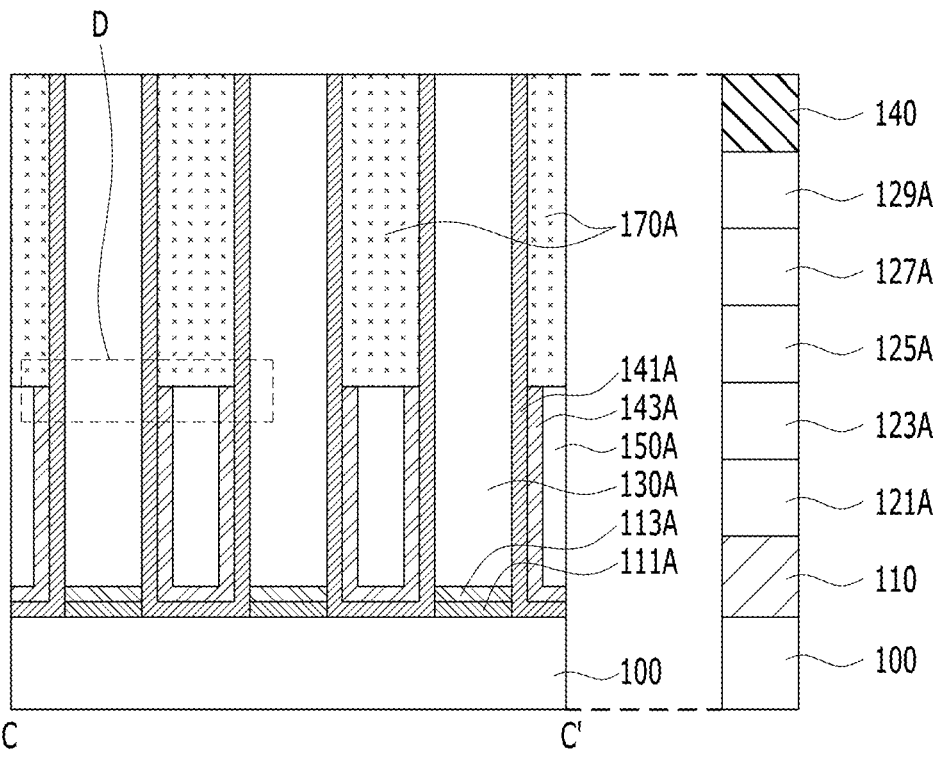

Referring to FIG. 1A to FIG. 1C, the semiconductor device may include first conductive lines 110, memory cells 120A, and second conductive lines 140, or a combination thereof. The second conductive lines 140 are not shown in FIG. 1 to clearly illustrate the structure. The semiconductor device may further include a substrate 100, first liner patterns 111A, first capping patterns 113A, first gap-fill patterns 130A, second liner patterns 141A, second capping patterns 143A, second gap-fill patterns 150A, and third gap-fill patterns 170A, or a combination thereof.

The memory cells 120A may be arranged in a first direction I and a second direction II intersecting the first direction I. The memory cell 120A may be located between the first conductive line 110 and the second conductive line 140. The memory cell 120A may include a variable resistance pattern 127A. The memory cell 120A may further include a first electrode pattern 121A, a switching pattern 123A, a second electrode pattern 125A, and a third electrode pattern 129A, or a combination thereof.

The switching pattern 123A may be located on the first electrode pattern 121A. The second electrode pattern 125A may be located on the switching pattern 123A. The first electrode pattern 121A, the switching pattern 123A, and the second electrode pattern 125A may constitute a select element. The select element may be a diode, a PNP diode, a transistor, a vertical transistor, a bipolar junction transistor (BJT), a metal insulator transition (MIT) element, a mixed ionic-electronic conduction (MIEC) element, an ovonic threshold switching (OTS) element, or the like. For example, the switching pattern 123A may include a chalcogenide material. The first electrode pattern 121A may be a bottom electrode, and the second electrode pattern 125A may be an intermediate electrode. The first electrode pattern 121A, or the second electrode pattern 125A, or both may include metal, metal nitride, carbon, carbon nitride, or the like.

The variable resistance pattern 127A may be located on the second electrode pattern 125A. The third electrode pattern 129A may be located on the variable resistance pattern 127A. The second electrode pattern 125A, the variable resistance pattern 127A, and the third electrode pattern 129A may constitute a memory element. The memory element and the select element may share the second electrode pattern 125A. The variable resistance pattern 127A may include a chalcogenide material. The third electrode pattern 129A may be a top electrode. The third electrode pattern 129A may include metal, metal nitride, carbon, carbon nitride, or the like.

The first conductive lines 110 may extend in the first direction I. The first conductive lines 110 may be spaced apart from each other in the second direction II. The first conductive lines 110 may be located on the substrate 100. For example, the first conductive line 110 may be located under the memory cell 120A and electrically connected to the first electrode pattern 121A. The first conductive line 110 may be a word line or a bit line. The first conductive line 110 may include a conductive material such as tungsten.

The second conductive lines 140 may extend in the second direction II. The second conductive lines 140 may be spaced apart from each other in the first direction I. The second conductive line 140 may be located on the memory cell 120A and electrically connected to the third electrode pattern 129A. The second conductive line 140 may be a word line or a bit line. For example, the first conductive line 110 may be a word line and the second conductive line 140 may be a bit line. As another example, the first conductive line 110 may be a bit line and the second conductive line 140 may be a word line. The second conductive line 140 may include a conductive material such as tungsten.

The first liner patterns 111A may extend in the first direction I and surround sidewalls of the memory cells 120A. The first liner patterns 111A may extend to sidewalls of the first conductive lines 110.

The first liner patterns 111A may extend along a surface of the substrate 100 exposed between the first conductive lines 110. The first liner patterns 111A may protect the memory cell 120A during a manufacturing process. For example, the first liner patterns 111A may prevent the memory cell 120A from being oxidized during the manufacturing process. The first liner patterns 111A may each include an insulating material such as nitride or oxide. For example, the first liner patterns 111A may each include silicon nitride.

The first capping patterns 113A may extend in the first direction I and cover sidewalls of the first liner patterns 111A. The first capping pattern 113A may be located on the first liner pattern 111A. The first capping pattern 113A may protect the memory cell 120A during the manufacturing process together with the first liner pattern 111A. The first capping pattern 113A may include an insulating material such as nitride or oxide. For example, the first capping pattern 113A may include silicon nitride.

The first gap-fill pattern 130A may be located between the first capping patterns 113A adjacent in the second direction II. The first gap-fill pattern 130A may fill a space between the memory cells 120A adjacent in the second direction II. The first gap-fill pattern 130A may include an insulating material such as nitride or oxide. For example, the first gap-fill pattern 130A may include silicon oxide, silicon oxycarbide, or the like.

The second liner patterns 141A may be spaced apart from each other in the second direction II. The second liner patterns 141A may extend in the second direction II and cover sidewalls of the memory cells 120A. The second liner patterns 141A may extend to sidewalls of the second conductive lines 140. The second liner patterns 141A may extend along the surface of the substrate 100 exposed between the memory cells 120A. The second liner patterns 141A may protect the memory cell 120A during the manufacturing process. For example, the second liner patterns 141A may prevent the memory cell 120A from being oxidized during the manufacturing process. The second liner patterns 141A may each include an insulating material such as nitride or oxide. For example, the second liner patterns 141A may each include silicon nitride.

The second capping patterns 143A may be spaced apart from each other in the second direction II. The second capping patterns 143A may extend in the second direction II and cover sidewalls of the second liner patterns 141A. The second capping pattern 143A may be located on the second liner pattern 141A. The second capping pattern 143A may protect the memory cell 120A during the manufacturing process together with the second liner pattern 141A. The second capping pattern 143A may include an insulating material such as nitride or oxide. For example, the second capping pattern 143A may include silicon nitride.

The second gap-fill pattern 150A may be located between the second capping patterns 143A adjacent in the first direction I. The second gap-fill pattern 150A may fill a space between the memory cells 120A adjacent in the first direction I. The second gap-fill pattern 150A may include an insulating material such as nitride or oxide. For example, the second gap-fill pattern 150A may include silicon oxide, silicon oxycarbide, or the like.

Referring to FIG. 1A to FIG. 1D, the third gap-fill pattern 170A may be located between the second gap-fill patterns 150A adjacent in the second direction II. Bottom surfaces of the third gap-fill patterns 170A may be located below a bottom surface of the variable resistance pattern 127A. The bottom surfaces of the third gap-fill patterns 170A may be located between the bottom surface of the first electrode pattern 121A and the surface of the substrate 100 or may be located to be in contact with the substrate 100. The third gap-fill patterns 170A may each include an insulating material such as oxide or nitride. For example, the third gap-fill pattern 170A may include silicon oxide, silicon oxycarbide, or the like.

Top surfaces of the second capping patterns 143A may be located at a level substantially the same as or different from the level of the bottom surface of the variable resistance pattern 127A. For example, the top surfaces of the second capping patterns 143A may be located below the bottom surface of the variable resistance pattern 127A. Accordingly, the second capping patterns 143A may not be located at a level corresponding to the level of the variable resistance pattern 127A.

Figure 1E:
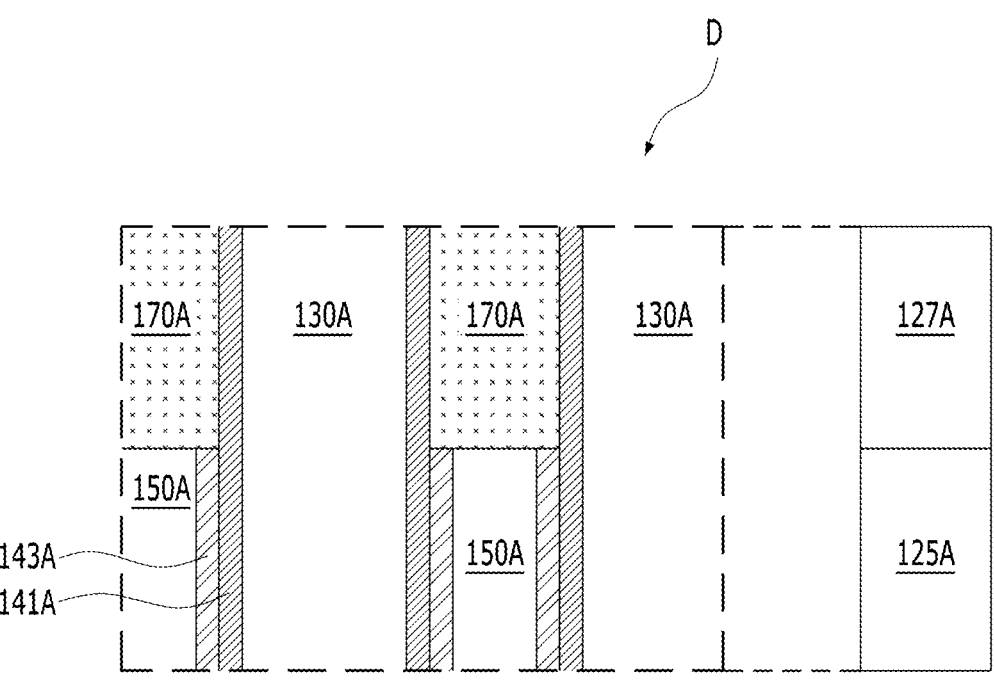
Figure 1F:
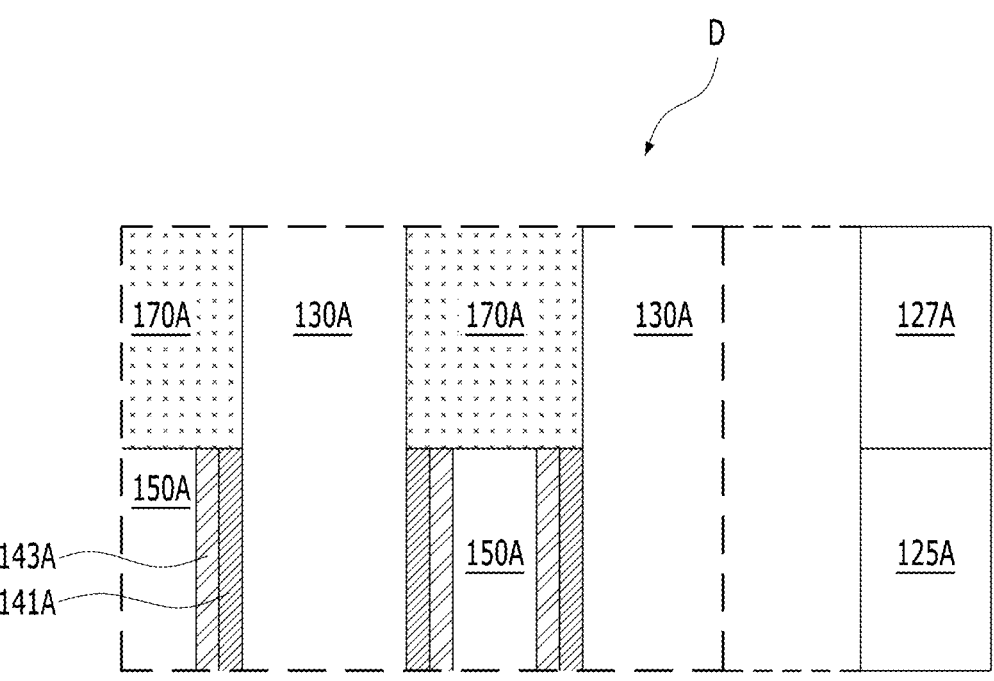

Referring to FIG. 1A and FIG. 1E, the third gap-fill pattern 170A may be located between the first gap-fill patterns 130A adjacent in the first direction I, and may be in contact with the second liner patterns 141A adjacent in the first direction I. Referring to FIG. 1A and FIG. 1F, the third gap-fill pattern 170A may be in contact with the first gap-fill patterns 130A adjacent in the first direction I.

The second liner patterns 141A in FIG. 1E may extend over the variable resistance pattern 127A, and the second capping patterns 143A may not be located at levels corresponding to the level of the variable resistance pattern 127A. The second liner patterns 141A and the second capping patterns 143A in FIG. 1F may not be located at levels corresponding to the level of the variable resistance pattern 127A. In some embodiments, the second liner pattern 141A and/or the second capping pattern 143A may not exist between the memory cells 120A adjacent in the second direction II. For example, only the second capping patterns 143A may be removed. As another example, a part of the second liner patterns 141A and the second capping patterns 143A may be removed. As another example, the second liner patterns 141A and the second capping patterns 143A may be removed. Accordingly, transfer of heat between the memory cells 120A adjacent in the second direction II through the second liner patterns 141A and/or the second capping patterns 143A may be reduced. In the embodiments shown in FIGS. 1E and 1F, the second liner patterns 141A, or the second capping patterns 143A, or both are formed to extend up to a level substantially equal to or lower than a bottom surface of a first variable resistance pattern 127A of a first memory cell 120A. As a result, heat generated from the first variable resistance pattern 127A of the first memory cell 120A may not be effectively transferred to a second memory cell 120A adjacent to the first memory cell 120A in the second direction II through the second liner patterns 141A and the second capping patterns 143A.

According to the structure described above, the first liner patterns 111A and the first capping patterns 113A may be located on the sidewalls of the memory cell 120A adjacent in the second direction II, and the second liner patterns 141A and the second capping patterns 143A may be located on the sidewalls of the memory cell 120A adjacent in the first direction I. The first liner patterns 111A and the first capping patterns 113A of the memory cell 120A adjacent in the first direction I may be separated from each other, and the second liner patterns 141A and the second capping patterns 143A of the memory cell 120A adjacent in the second direction II may be separated from each other.

Accordingly, even though heat is generated during the operation of the memory cell 120A, it is possible to block, minimize, or reduce transfer of the generated heat to surrounding memory cells 120A along the first liner patterns 111A, the first capping patterns 113A, the second liner patterns 141A, and the second capping patterns 143A. Since the second liner patterns 141A and the second capping patterns 143A do not exist at levels corresponding to the level of the variable resistance pattern 127A where heat is mainly generated, it is possible to effectively reduce transfer of heat between memory cells.

Figure 2A:
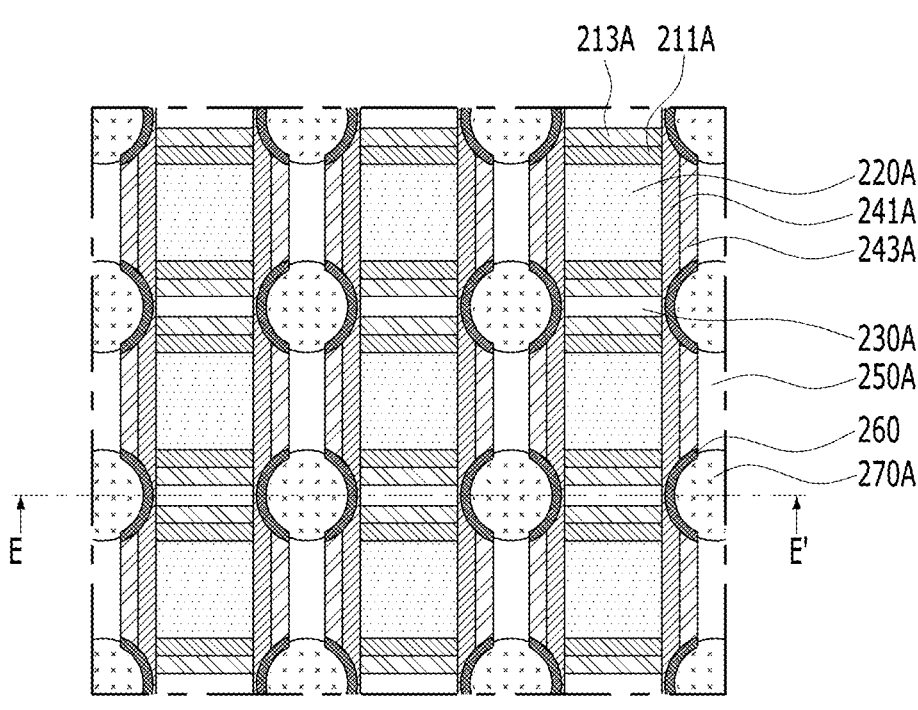
FIGS. 2A, 2B, and 2C are diagrams for describing a semiconductor device in accordance with an embodiment.
Figure 2A:
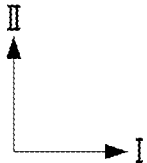
Figure 2B:
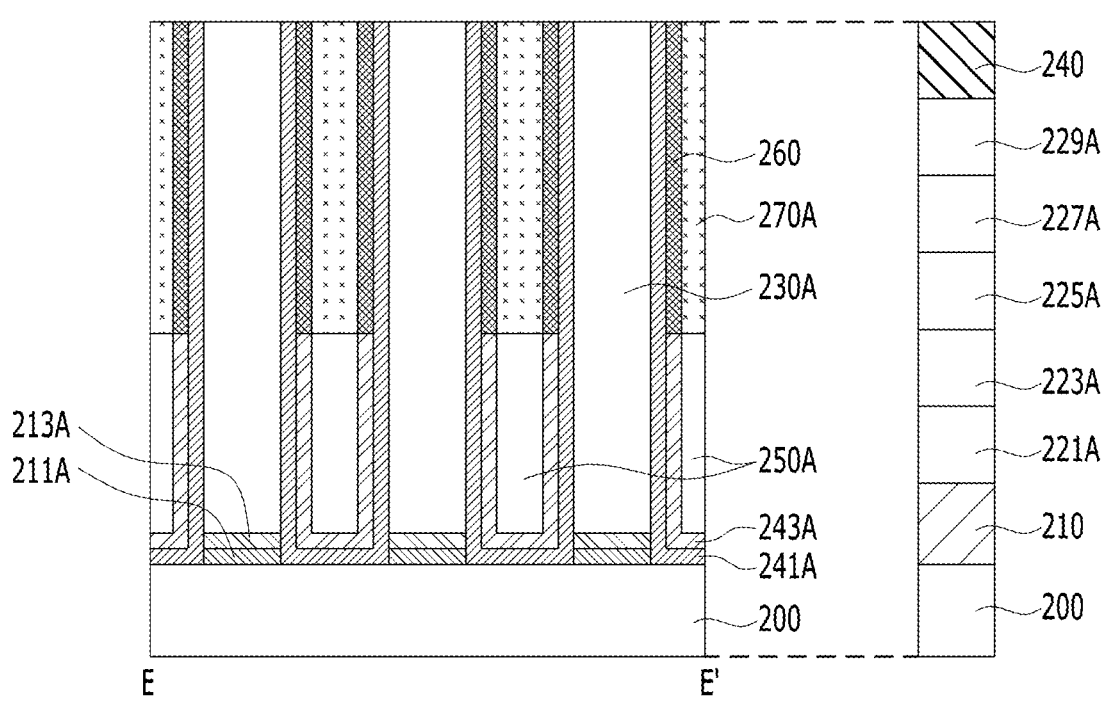
Figure 2C:
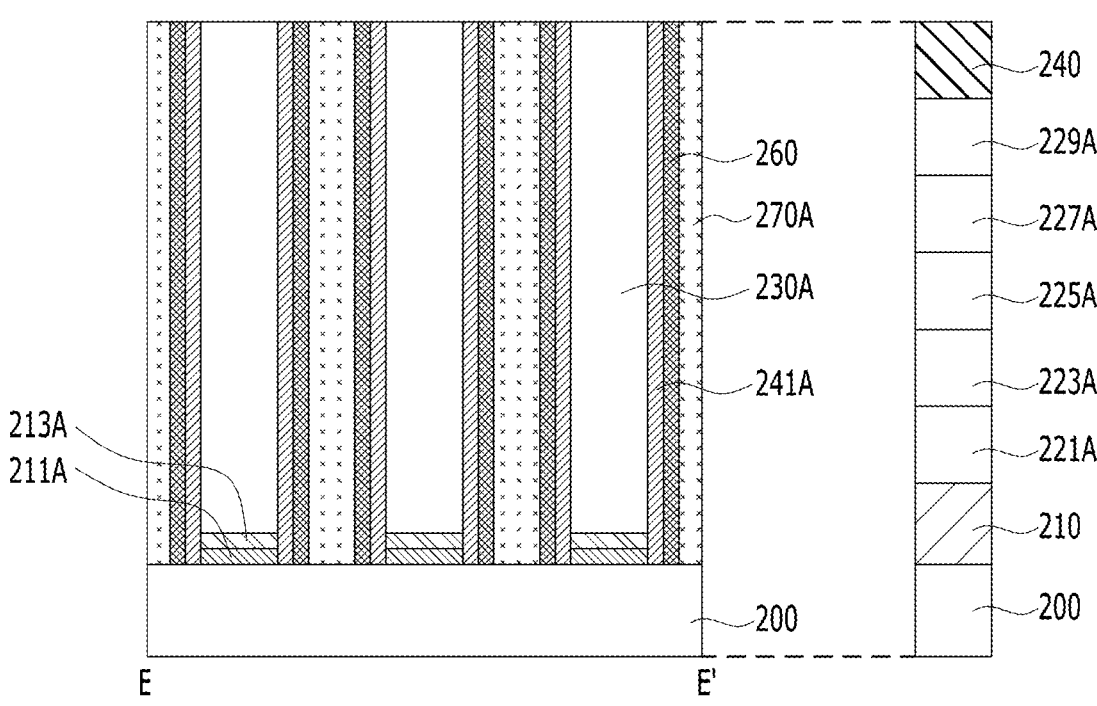

FIG. 2A to FIG. 2C are diagrams for describing a semiconductor device in accordance with an embodiment. FIG. 2A may be a plan view and FIG. 2B and FIG. 2C may be cross-sectional views taken along line E-E' in FIG. 2A. Hereinafter, the content overlapping with the previously described content may be omitted for the interest of brevity.

Referring to FIG. 2A to FIG. 2C, the semiconductor device may include memory cells 220A, a substrate 200, first liner patterns 211A, first capping patterns 213A, first gap-fill patterns 230A, second liner patterns 241A, second capping patterns 243A, second gap-fill patterns 250A, and third gap-fill patterns 270A, or a combination thereof. The semiconductor device may further include barrier layers 260.

The barrier layer 260 may be located between the second gap-fill patterns 250A adjacent in the second direction II. The second gap-fill patterns 250A adjacent in the second direction II may be separated from each other by the barrier layer 260. In the first direction I, the barrier layer 260 may be located between the first gap-fill pattern 230A and the third gap-fill pattern 270A. The second liner pattern 241A may not exist between the barrier layer 260 and the first gap-fill pattern 230A, and the barrier layer 260 and the first gap-fill pattern 230A may be in contact with each other. The second liner pattern 241A may exist between the barrier layer 260 and the first gap-fill pattern 230A, the barrier layer 260 may protrude into the second liner pattern 241A, and the second liner pattern 241A may have a relatively thin thickness in a corresponding area. The barrier layer 260 may include an insulating material such as oxide or nitride.

The barrier layer 260 may include a material having low thermal conductivity. For example, the barrier layer 260 may include a material having lower thermal conductivity than the second liner pattern 241A, or the second capping pattern 243A, or both. The second liner pattern 241A, or the second capping pattern 243A, or both may include nitride, and the barrier layer 260 may include nitride. The barrier layer 260 may be an oxide layer formed by oxidizing the second capping pattern 243A and/or the second liner pattern 241A.

The barrier layer 260 may surround a part of a sidewall of the third gap-fill pattern 270A. Accordingly, the shape of the barrier layer 260 may be similar to that of the sidewall of the third gap-fill pattern 270A. For example, when the third gap-fill pattern 270A has a circular shape, the barrier layer 260 may include a curved surface that is a part of the circular shape.

The second liner patterns 241A and/or the second capping patterns 243A may not be located between the memory cells 220A adjacent in the second direction II. In such a case, the barrier layer 260 may exist in a region where the second liner patterns 241A and/or the second capping patterns 243A are not located. For example, in the case of FIG. 2B, the second capping patterns 243A may be located at levels corresponding to the level of a second electrode pattern 225A, and the barrier layer 260 may exist in a region where the second capping patterns 243A are not located. In the case of FIG. 2C, the second liner patterns 241A and/or the second capping patterns 243A may not exist between the memory cells 220A and the barrier layer 260 may be located to be in contact with the substrate 200.

According to the structure described above, the barrier layer 260 may be located at a level corresponding to the level of the variable resistance pattern 227A where heat is mainly generated during the operation of the memory cell 220A or below the variable resistance pattern 227A, and the barrier layer 260 may include a material having lower thermal conductivity than the second liner pattern 241A or the second capping pattern 243A. For example, the barrier layer 260 may extend down to a level substantially equal to or lower than a bottom surface of the variable resistance pattern 227A of the memory cell 220A.

Accordingly, even though heat is generated during the operation of the memory cell 220A, it is possible to block, minimize, or reduce transfer of heat to surrounding memory cells 220A by the barrier layer 260.

Figure 3A:
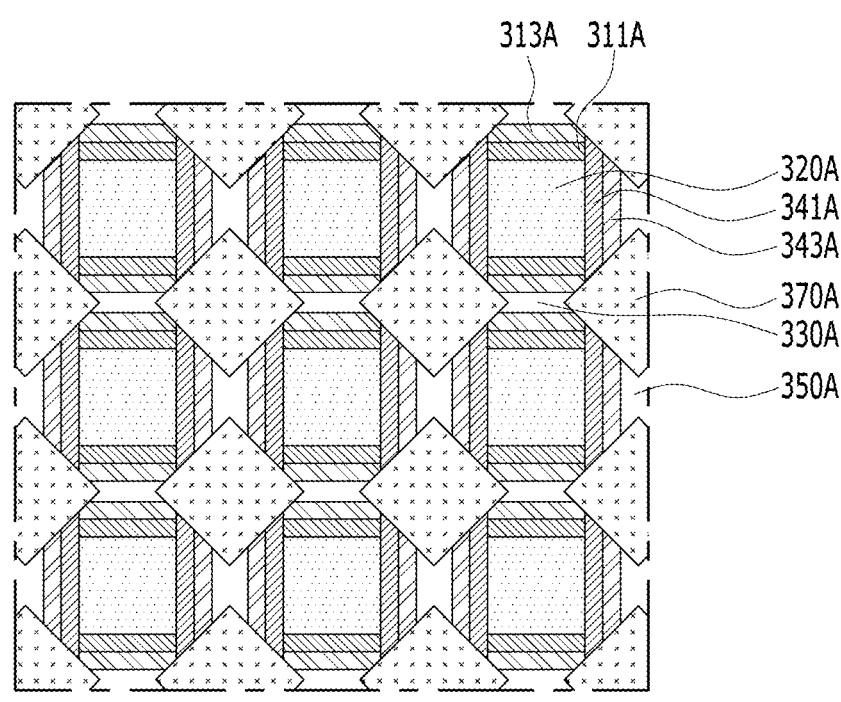
FIG. 3A and FIG. 3B are diagrams for describing a semiconductor device in accordance with an embodiment.
Figure 3A:
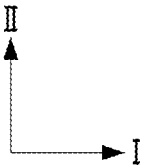
Figure 3B:
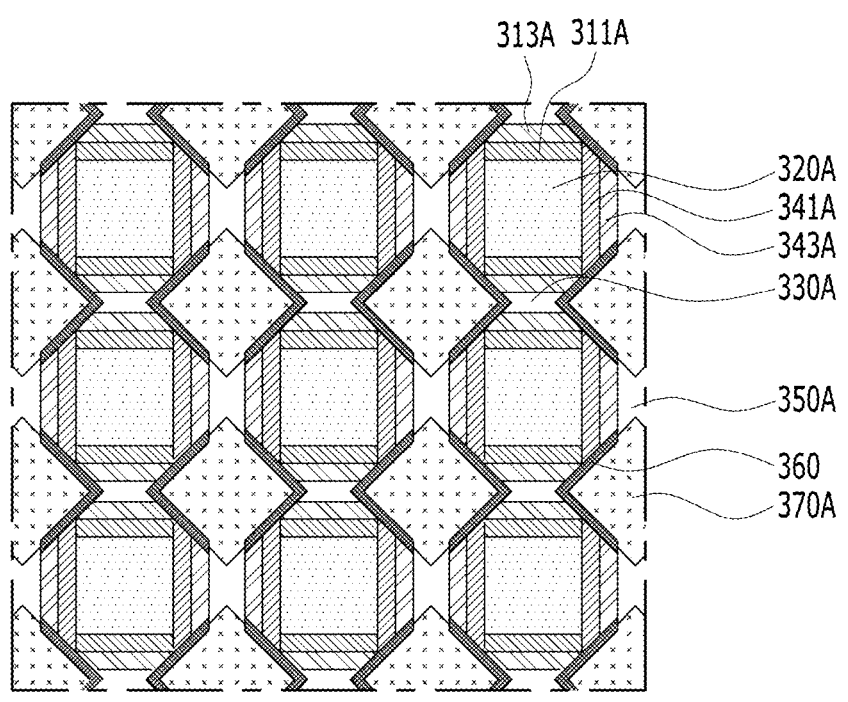
Figure 3B:
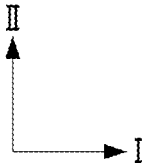

FIG. 3A and FIG. 3B are diagrams for describing a semiconductor device in accordance with an embodiment. FIG. 3A and FIG. 3B may be plan views. Hereinafter, the content overlapping with the previously described content may be omitted for the interest of brevity.

Referring to FIG. 3A and FIG. 3B, the semiconductor device includes memory cells 320A, a substrate 300, first liner patterns 311A, first capping patterns 313A, first gap-fill patterns 330A, second liner patterns 341A, second capping patterns 343A, second gap-fill patterns 350A, and third gap-fill patterns 370A, or a combination thereof. The semiconductor device may further include barrier layers 360.

The third gap-fill pattern 370A is for separating the second liner patterns 341A and/or the second capping patterns 343A of the memory cells 320A adjacent in the second direction II from each other, and may be located between the memory cells 320A. For example, the third gap-fill pattern 370A may be located at the center of a rectangle defined by four memory cells 320A arranged in the first direction I and the second direction II.

The third gap-fill pattern 370A may be formed in a size or shape that does not invade the memory cell 320A. For example, the third gap-fill pattern 370A may have a size or shape that separates the second liner patterns 341A and/or the second capping patterns 343A and does not invade the memory cell 320A. Specifically, in the embodiment shown in FIG. 3A, the third gap-fill pattern 370A may have a size sufficiently large to separate at least the second capping patterns 343A adjacent in the second direction II and sufficiently small not to damage the memory cells 320A adjacent to the third gap-fill pattern 370A. In the embodiment shown in FIG. 3B, the combined structure of the third gap-fill pattern 370A and the barrier layer 360 may have a size sufficiently large to separate at least the second capping patterns 343A adjacent in the second direction II and sufficiently small not to damage the memory cells 320A adjacent to the third gap-fill pattern 370A.

When the size of the three gap-fill pattern 370A is excessively large, the second liner patterns 341A and/or the second capping patterns 343A may be effectively separated from each other, but the memory cells 320A may be damaged. When the size of the third gap-fill pattern 370A is excessively small, the second liner patterns 341A or the second capping patterns 343A might not be properly separated, causing an undesirable amount of heat transfer between the memory cells 320A adjacent in the second direction II. Accordingly, the third gap-fill pattern 370A may be formed in a size that prevents damage to the memory cells 320A and separates the second liner patterns 341A or the second capping patterns 343A while minimizing transfer of heat between the memory cells 320A.

The third gap-fill pattern 370A may have various shapes that separate the second liner patterns 341A and/or the second capping patterns 343A while securing a distance margin from the memory cell 320A. The third gap-fill pattern 370A may have various shapes such as a circular shape, an elliptical shape, or a polygonal shape.

For example, when the third gap-fill pattern 370A has a rhombus shape, a distance margin between the third gap-fill pattern 370A and the memory cell 320A may be secured while the second liner patterns 341A or the second capping patterns 343A are sufficiently separated through the corner portion of the rhombus.

According to the structure described above, the third gap-fill pattern 370A and the barrier layer 360 may have various shapes and sizes as long as the third gap-fill pattern 370A and the barrier layer 360 do not damage the memory cell 320A.

Figure 4A:
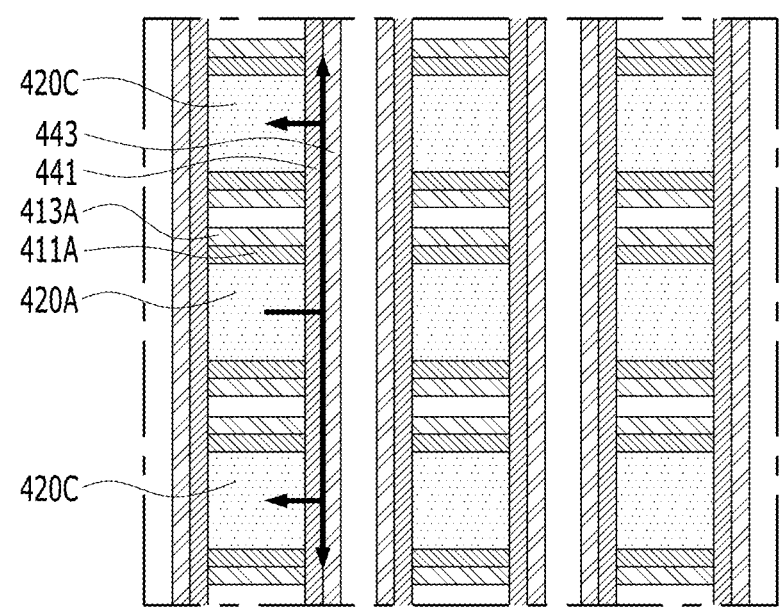
FIG. 4A and FIG. 4B are diagrams for describing effects of a semiconductor device in accordance with an embodiment.
Figure 4A:
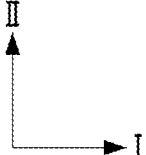
Figure 4B:
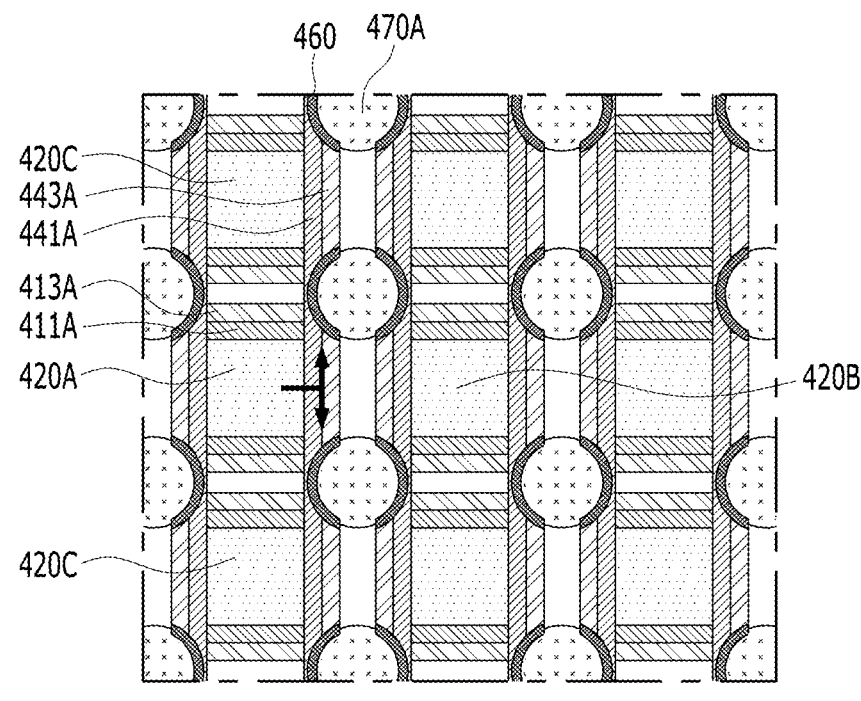
Figure 4B:
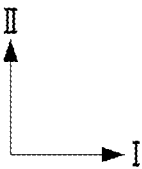

FIG. 4A and FIG. 4B are diagrams for describing effects of a semiconductor device in accordance with an embodiment. FIG. 4A and FIG. 4B may be plan views. Hereinafter, the content overlapping with the previously described content may be omitted for the interest of brevity.

Referring to FIG. 4A, heat may be generated in a variable resistance pattern during an operation of a first memory cell 420A, and the generated heat may be transferred to a second memory cell 420B and a third memory cell 420C. For example, heat generated in the first memory cell 420A may be transferred to the second memory cell 420B adjacent to the first memory cell 420A in the second direction II. The heat generated in the first memory cell 420A may be transferred to the third memory cell 420C adjacent to the first memory cell 420A in the second direction II.

The heat generated in the first memory cell 420A may be transferred along first liner patterns 411A, first capping patterns 413A, second liner layers 441 and second capping layers 443 surrounding the sidewalls of the first memory cell 420A. However, the degree of transfer of the heat may vary depending on the shapes of the first liner patterns 411A, the first capping patterns 413A, the second liner layers 441, and the second capping layers 443.

Since the first liner patterns 411A and the first capping patterns 413A cover each of the memory cells 420A, 420B, and 420C, the heat generated from the first memory cell 420A may be less transferred to the second memory cell 420B. Specifically, the first liner patterns 411A and the first capping patterns 413A cover a first sidewall of the first memory cell 420A and a second sidewall of the second memory cell 420B with a gap-fill pattern disposed between the first and second sidewalls adjacent to each other in the second direction II. As a result, a relatively small amount of heat may be transferred from the first memory cell 420A to the second memory cell 420B through a thermal path along the second direction II that includes the first liner patterns 411A, the first capping patterns 413A, and the gap-fill pattern. On the other hand, the second liner layers 441 and the second capping layers 443 may extend in the second direction II. The second liner layers 441 and the second capping layers 443 located on the sidewalls of the first memory cell 420A may extend to the sidewalls of the third memory cell 420C. Accordingly, the heat generated from the first memory cell 420A may be transferred to the third memory cell 420C along the second liner layers 441 and the second capping layers 443.

When the heat generated in the first memory cell 420A is transferred to the second memory cell 420B and the third memory cell 420C, data in the second memory cell 420B and the third memory cell 420C may be changed and reliability may be reduced. The second liner layers 441, the second capping layers 443, and a gap-fill pattern are disposed between sidewalls of memory cells adjacent in the first direction I, thereby making a thermal resistance between the memory cells adjacent in the first direction I greater than that between memory cells adjacent in the second direction II. As a result, a heat transfer rate in the memory cells adjacent in the second direction II may be higher than that in memory cells adjacent in the first direction I and reliability of the memory cells adjacent in the second direction II may be further reduced than that of the memory cells adjacent in the first direction I.

Referring to FIG. 4B, the first liner patterns 411A, the first capping patterns 413A, second liner patterns 441A, and second capping patterns 443A may surround each of the memory cells 420A, 420B, and 420C. In other words, the first liner patterns 411A and the first capping patterns 413A of the first memory cell 420A are separated from the first liner patterns 411A and the first capping pattern 413A of the second memory cell 420B. The second liner patterns 441A and the second capping patterns 443A of the first memory cell 420A are also separated from the second liner patterns 441A and the second capping patterns 443A of the third memory cell 420C. Accordingly, heat generated from the first memory cell 420A may not be significantly transferred along the first liner patterns 411A, the first capping patterns 413A, the second liner patterns 441A, and the second capping patterns 443A.

A barrier layer 460 may be located between the second liner patterns 441A or the second capping patterns 443A separated from each other in the second direction II. The barrier layer 460 may include a material having lower thermal conductivity than the second liner patterns 441A, or the second capping patterns 443A, or both.

Even though the second liner patterns 441A are not separated from each other and remain between the memory cells 420A and 420C adjacent to each other in the second direction II, transfer of heat may be reduced by the barrier layer 460 including a material having low thermal conductivity.

According to the structure described above, each of the memory cells 420A, 420B, and 420C may include the first liner patterns 411A and the first capping patterns 413A separated from each other in the first direction I, and may include the second liner patterns 441A and the second capping patterns 443A separated from each other in the second direction II. The barrier layer 460 may be additionally located between the second liner pattern 441A and the second capping pattern 443A adjacent in the second direction II. Accordingly, it is possible to block, minimize, or reduce transfer of heat between memory cells adjacent in the first direction I and the second direction II, thereby improving reliability of the memory cells.

FIG. 5A and FIG. 5B, FIG. 6A and FIG. 6B, FIG. 7A and FIG. 7B, FIG. 8A and FIG. 8B, FIG. 9A and FIG. 9B, FIG. 10A to FIG. 10D, and FIG. 11A and FIG. 11B are diagrams for describing a manufacturing method of a semiconductor device in accordance with an embodiment. FIG. 5A, FIG. 6A, FIG. 7A, FIG. 8A, FIG. 9A, FIG. 10A, and FIG. 11A may be plan views, and FIG. 5B and FIG. 6B may be cross-sectional views taken along line A-A' in FIG. 5A and FIG. 6A, respectively. FIG. 7B and FIG. 8B may be cross-sectional views taken along line B-B' in FIG. 7A and FIG. 8A, respectively. FIG. 9B, FIG. 10B, and FIG. 11B may be cross-sectional views taken along line C-C' in FIG. 9A, FIG. 10A, and FIG. 11A, respectively. FIG. 10C may be an enlarged view of region D in FIG. 10B according to an embodiment, and FIG. 10D may be an enlarged view of a region corresponding to the region D in FIG. 10B according to another embodiment. Hereinafter, the content overlapping with the previously described content may be omitted for the interest of brevity.

Figure 5A:
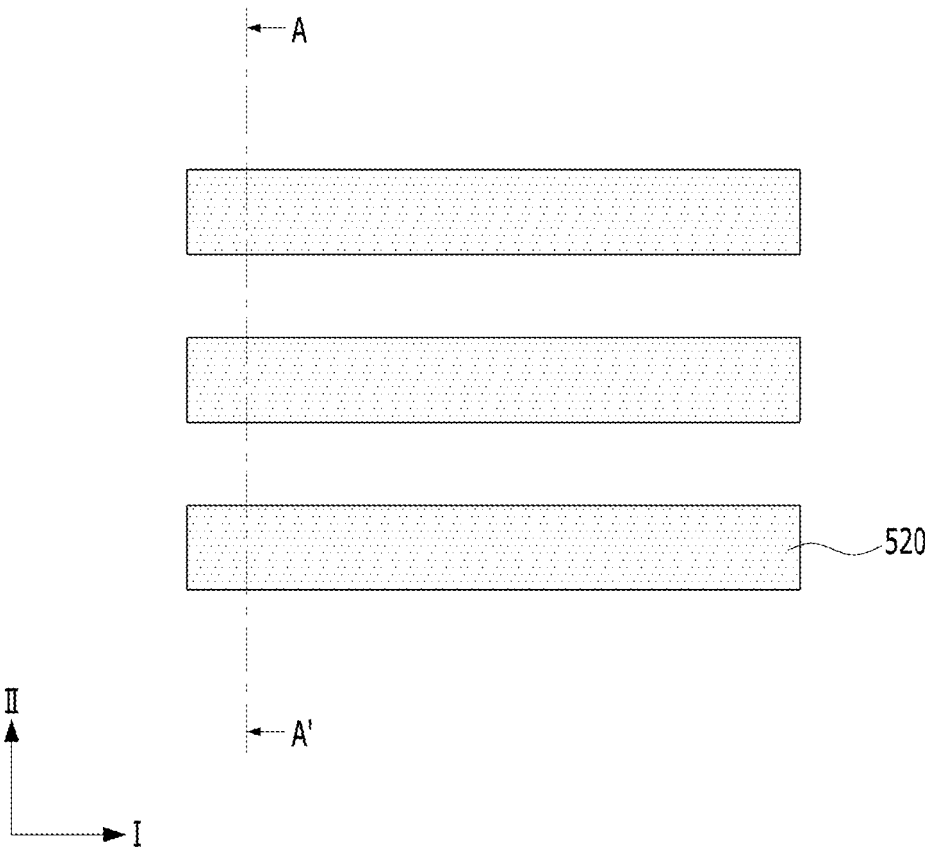
FIG. 5A and FIG. 5B, FIG. 6A and FIG. 6B, FIG. 7A and FIG. 7B, FIG. 8A and FIG. 8B, FIG. 9A and FIG. 9B, FIG. 10A, FIG. 10B, FIG. 10C, and FIG. 10D, and FIG. 11A and FIG. 11B are diagrams for describing a manufacturing method of a semiconductor device in accordance with an embodiment.
Figure 5B:
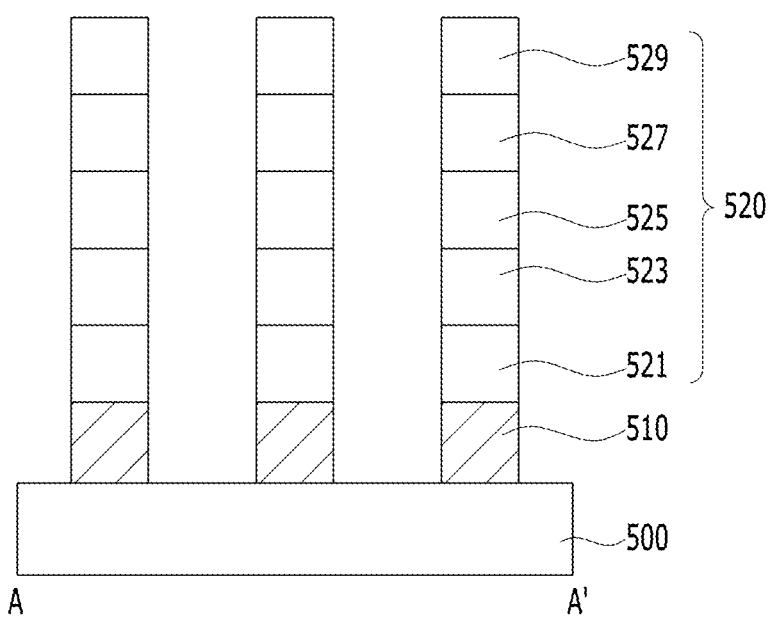

Referring to FIG. 5A and FIG. 5B, first conductive lines 510 and memory lines 520 extending in the first direction I may be formed on a substrate 500. The first conductive lines 510 and the memory lines 520 may be spaced apart from each other in the second direction II intersecting the first direction I.

First, a first conductive layer may be formed on the substrate 500 and a memory stack may be formed on the first conductive layer. The memory stack may include a variable resistance layer. For example, a memory stack may be formed by sequentially stacking a first electrode layer, a switching layer, a second electrode layer, a variable resistance layer, and a third electrode layer. Subsequently, the memory stack and the first conductive layer may be etched to form the first conductive lines 510 and the memory lines 520 extending in the first direction I. The memory line 520 may include a first electrode line 521, a switching line 523, a second electrode line 525, a variable resistance line 527, and a third electrode line 529.

The first conductive line 510 may be a word line or a bit line. The first conductive line 510 may include a conductive material. For example, the first conductive line 510 may include a metal material such as tungsten. The first electrode line 521, the second electrode line 525, and the third electrode line 529 may each include metal, metal nitride, carbon, carbon nitride, or the like. The switching line 523, or the variable resistance line 527, or both may include a chalcogenide material.

Figure 6A:
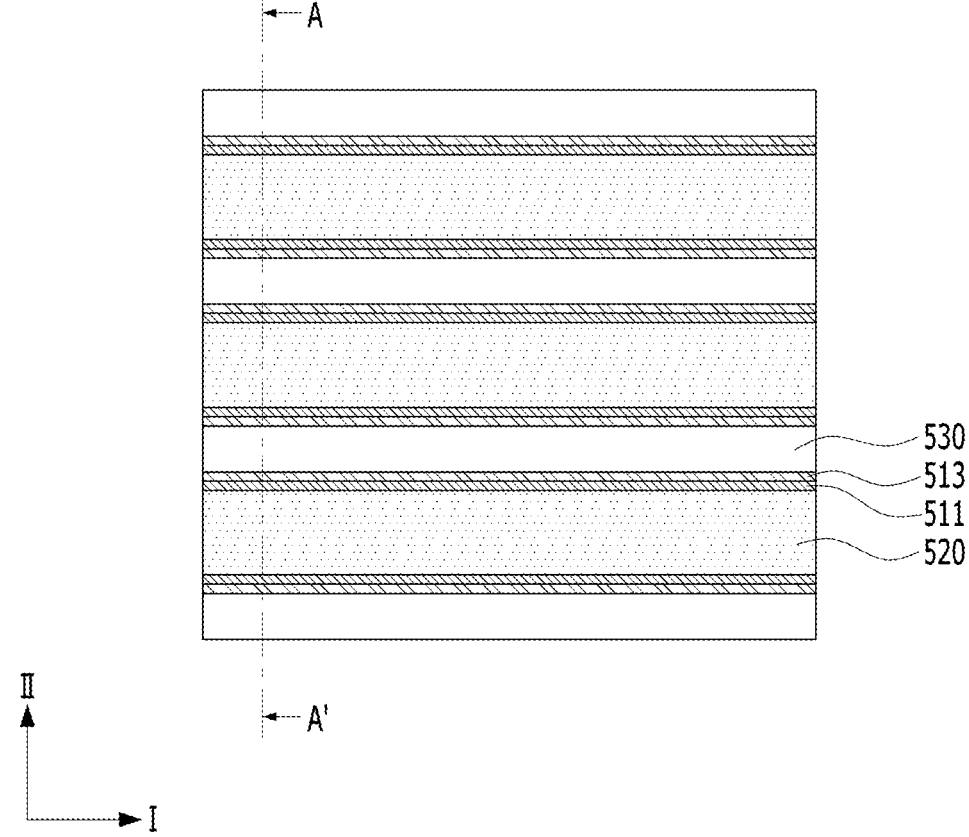
Figure 6B:
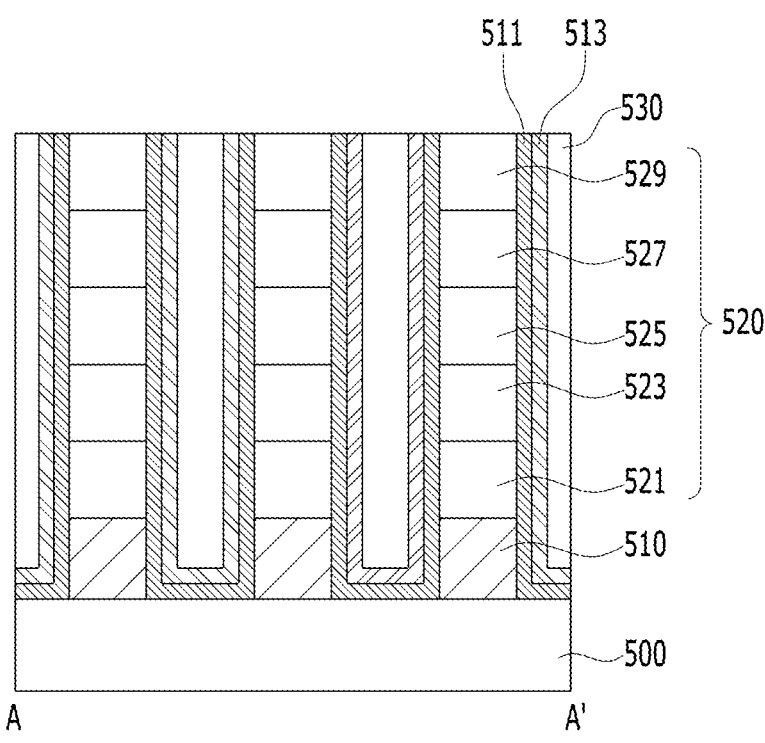

Referring to FIG. 6A and FIG. 6B, a first liner layer 511 may be formed. The first liner layer 511 may be formed on the first conductive lines 510 and the memory lines 520. For example, the first liner layer 511 may be formed along profiles of the first conductive lines 510 and the memory lines 520 extending in the first direction I. The first liner layer 511 may include an insulating material such as nitride or oxide. For example, the first liner layer 511 may include silicon nitride.

Subsequently, a first capping layer 513 may be formed on the first liner layer 511. For example, the first capping layer 513 may be formed along a profile of the first liner layer 511. The first capping layer 513 may include an insulating material such as oxide or nitride. For example, the first capping layer 513 may include silicon nitride.

Subsequently, a first gap-fill layer 530 may be formed on the first capping layer 513. The first gap-fill layers 530 extending in the first direction I may be formed to fill a space between the first capping layers 513. For example, the first gap-fill layers 530 may be formed between the memory lines 520 adjacent in the second direction II.

First, the first gap-fill layer 530 may be formed to fill a space between adjacent first capping layers 513. Subsequently, the first gap-fill layer 530, the first capping layer 513, and the first liner layer 511 may be planarized until a top surface of the memory line 520 is exposed. For example, the first gap-fill layer 530, the first capping layer 513, and the first liner layer 511 may be planarized until a top surface of the third electrode line 529 is exposed. The top surface of the third electrode line 529, a top surface of the first gap-fill layer 530, a top surface of the first capping layer 513, and a top surface of the first liner layer 511 may be located at substantially the same level or different levels.

In the process of forming the first gap-fill layer 530, the first capping layer 513, or the first liner layer 511, or both may protect the memory lines 520. For example, the first capping layer 513, or the first liner layer 511, or both may prevent the memory lines 520 from being oxidized. The first gap-fill layers 530 may each include an insulating material such as oxide or nitride. The first gap-fill layers 530 may each include silicon oxide, silicon oxycarbide, or the like.

Figure 7A:
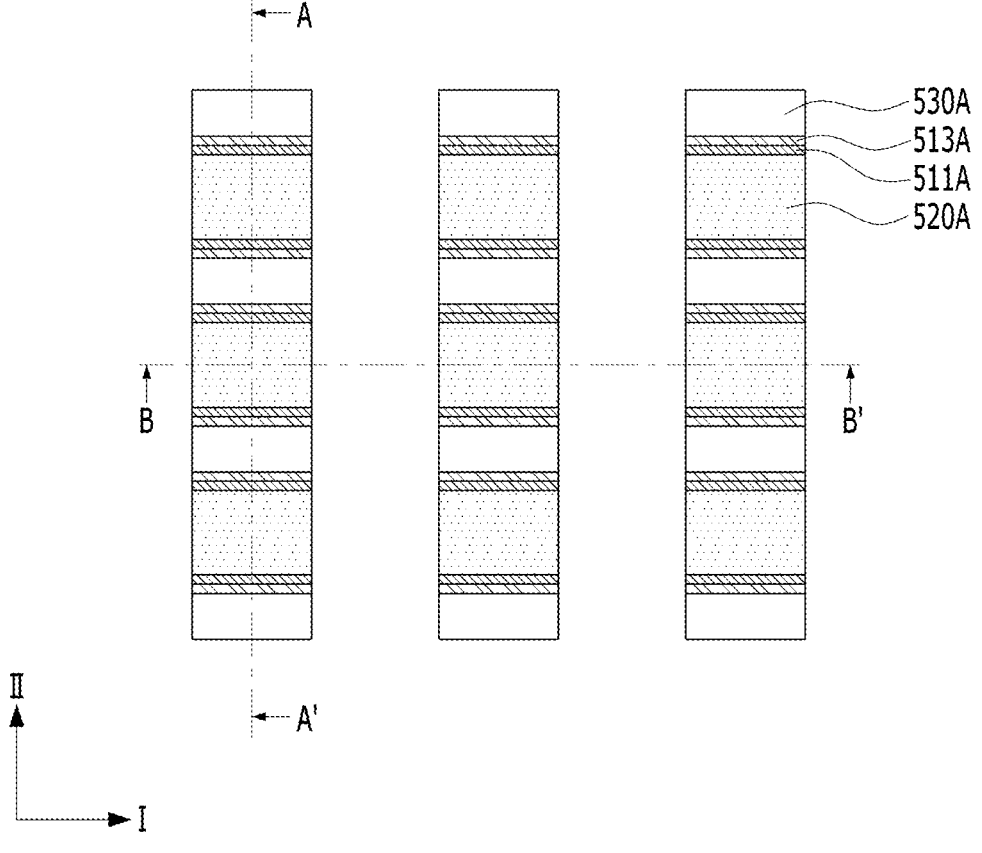
Figure 7B:
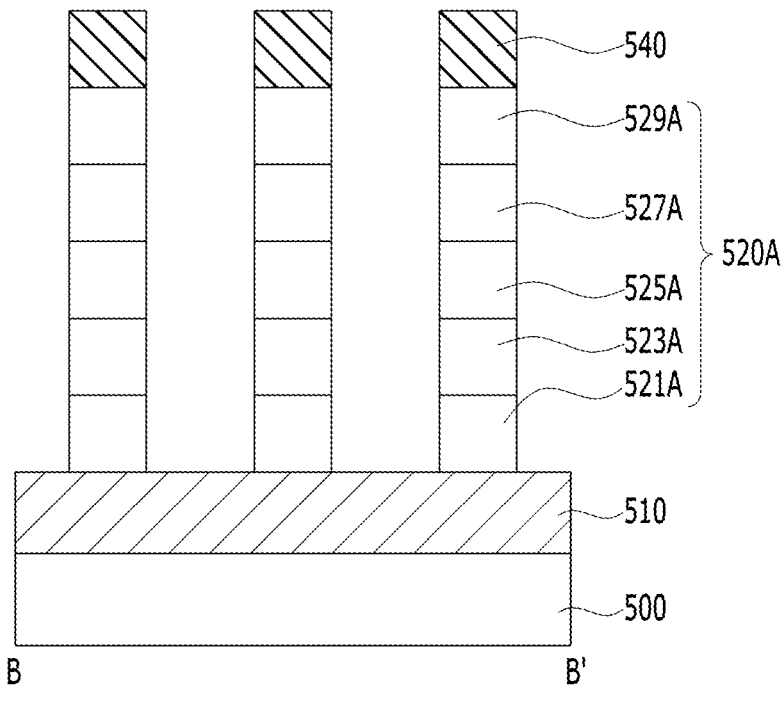

Referring to FIG. 7A and FIG. 7B, second conductive lines 540 extending in the second direction II and memory cells 520A arranged in the first direction I and the second direction II may be formed. In such a case, the second conductive lines 540 may be formed to be spaced apart from each other in the first direction I.

First, a second conductive layer may be formed on the memory lines 520. Subsequently, the memory lines 520 and the second conductive layer may be etched to form the second conductive lines 540 extending in the second direction II and the memory cells 520A arranged in the first direction I and the second direction II. In this process, the first liner layers 511, the first capping layers 513, and the first gap-fill layers 530 may also be etched together to form first liner patterns 511A, first capping patterns 513A, and first gap-fill patterns 530A, respectively.

The memory cells 520A may include a first electrode pattern 521A, a switching pattern 523A, a second electrode pattern 525A, a variable resistance pattern 527A, or a third electrode pattern 529A. The first electrode pattern 521A may be a bottom electrode, the second electrode pattern 525A may be an intermediate electrode, and the third electrode pattern 529A may be a top electrode.

The second conductive line 540 may be a word line or a bit line. For example, when the first conductive line 510 is a word line, the second conductive line 540 may be a bit line. As another example, when the first conductive line 510 is a bit line, the second conductive line 540 may be a word line. The second conductive line 540 may include a conductive material. For example, the second conductive line 540 may include a metal material such as tungsten.

Figure 8A:
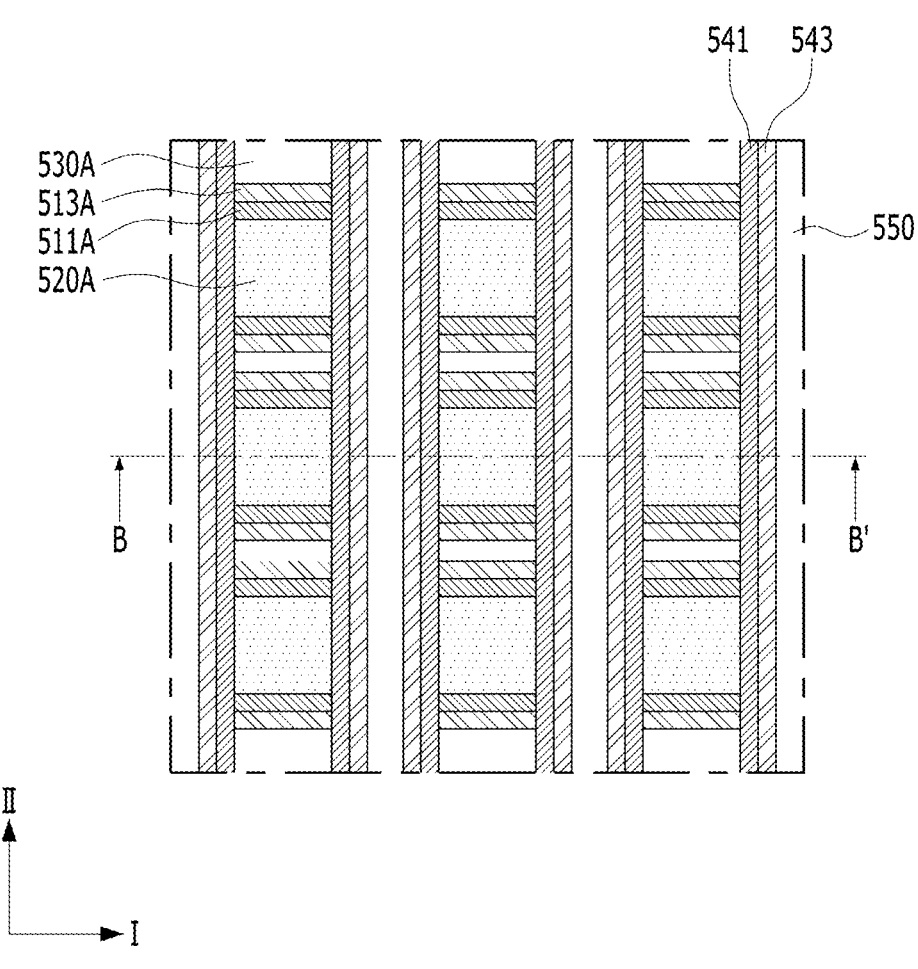
Figure 8B:
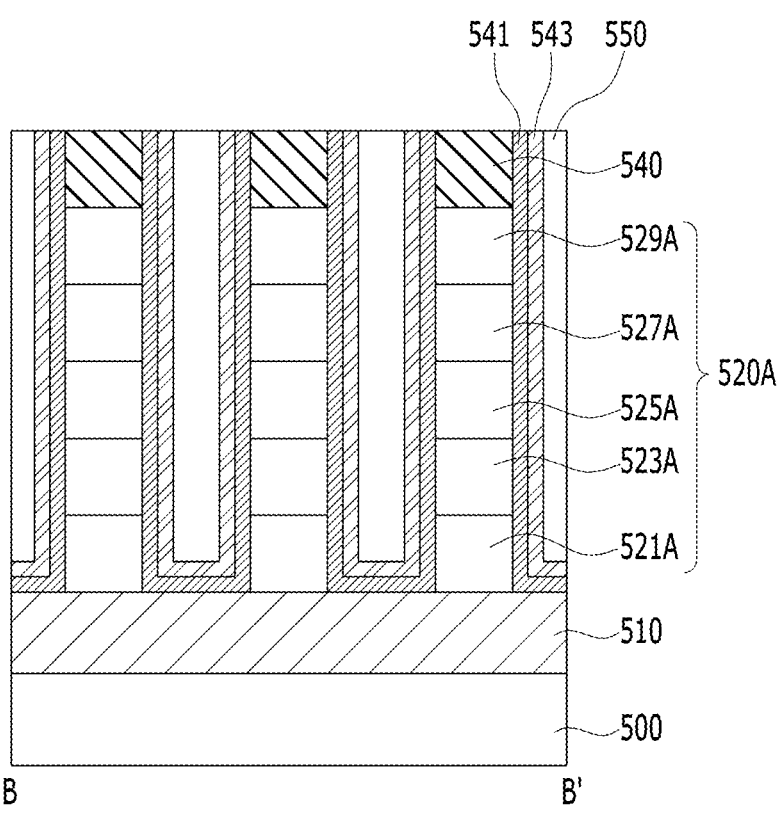

Referring to FIG. 8A and FIG. 8B, second liner layers 541 may be formed. The second liner layers 541 may be formed on the second conductive lines 540 and the memory cells 520A. For example, the second liner layer 541 may be formed along profiles of the second conductive lines 540 and the memory cells 520A extending in the second direction II. The second liner layer 541 may each include an insulating material such as nitride or oxide. For example, the second liner layer 541 may include silicon nitride.

Subsequently, a second capping layer 543 may be formed on the second liner layer 541. For example, the second capping layer 543 may be formed along a profile of the second liner layer 541. The second capping layer 543 may include an insulating material such as oxide or nitride. For example, the second capping layer 543 may include silicon nitride.

Subsequently, a second gap-fill layer 550 may be formed on the second capping layer 543. The second gap-fill layers 550 extending in the second direction II may be formed to fill a space between the second capping layers 543. For example, the second gap-fill layers 550 may be formed between the memory cells 520A adjacent in the first direction I.

First, the second gap-fill layer 550 may be formed to fill a space between adjacent second capping layers 543. Subsequently, the second gap-fill layer 550, the second capping layer 543, and the second liner layer 541 may be planarized until a top surface of the memory cell 520A is exposed. For example, the second gap-fill layer 550, the second capping layer 543, and the second liner layer 541 may be planarized until a top surface of the third electrode pattern 529A is exposed. The top surface of the third electrode pattern 529A, a top surface of the second capping layer 543, a top surface of the second liner layer 541, and a top surface of the second gap-fill layer 550 may be located at substantially the same level or different levels.

In the process of forming the second gap-fill layer 550, the second capping layer 543, or the second liner layer 541, or both may protect the memory cells 520A. For example, the second capping layer 543, or the second liner layer 541, or both may prevent the memory cells 520A from being oxidized. The second gap-fill layers 550 may each include an insulating material such as oxide or nitride. The second gap-fill layers 550 may each include silicon oxide, silicon oxycarbide, or the like.

Figure 9A:
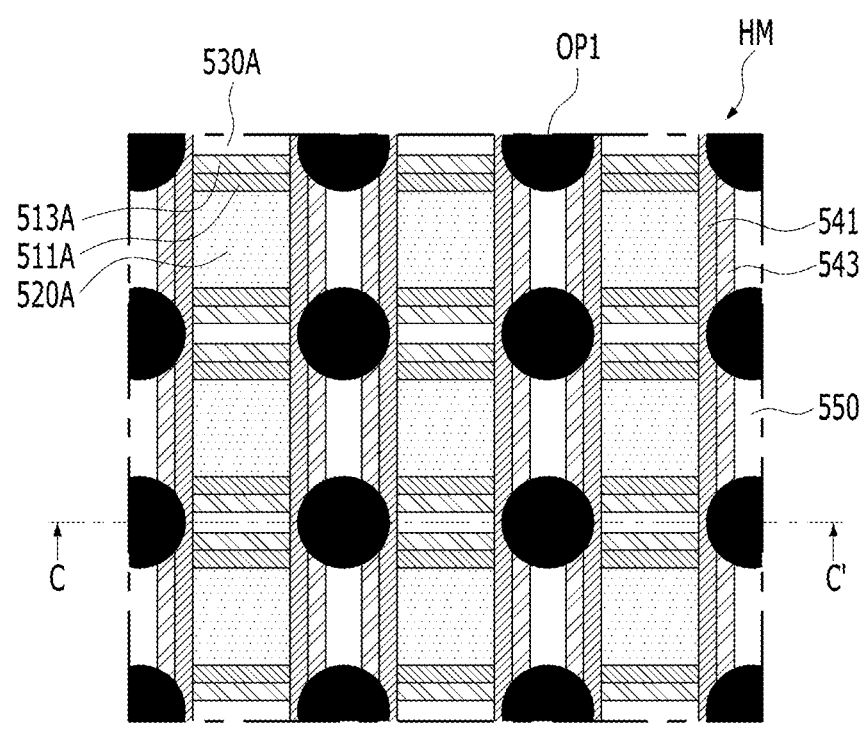
Figure 9A:
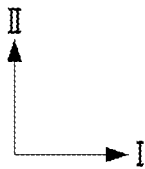
Figure 9B:
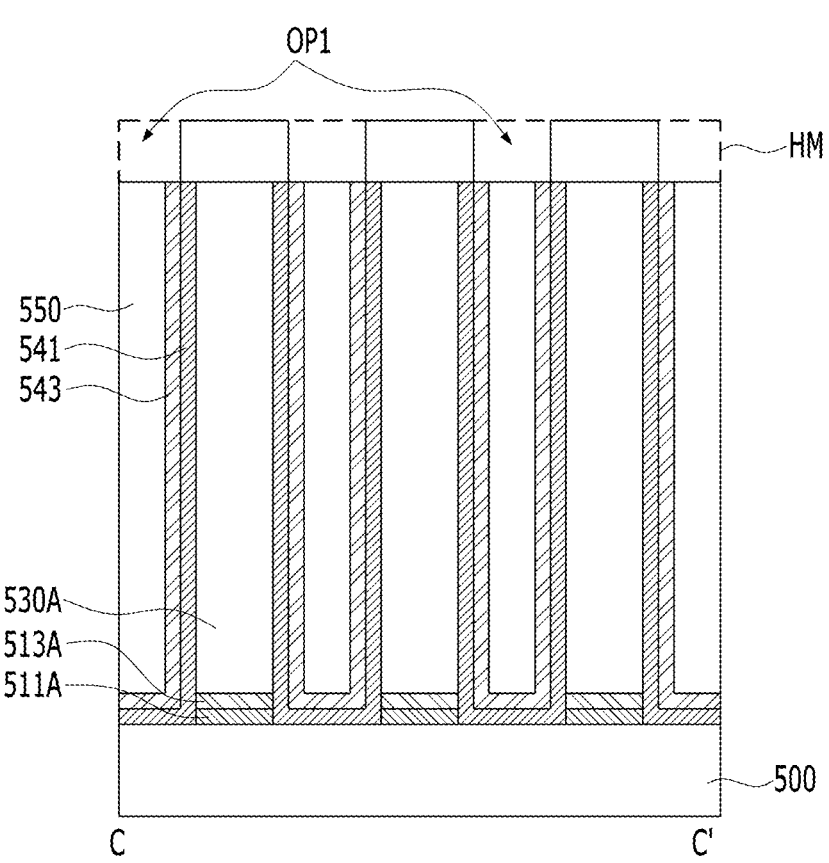

Referring to FIG. 9A and FIG. 9B, a hard mask pattern HM may be formed on the substrate 500. For example, the hard mask pattern HM including first openings OP1 may be formed. Although FIG. 9A shows portions that are covered by the hard mask pattern HM while not showing other portions that are exposed by the first openings OP1, this is merely for clearly illustrating the structure.

The first opening OP1 may be formed in a region where the memory cell 520A is not exposed. For example, the first opening OP1 may be formed at the center of a rectangle defined by four memory cells 520A formed in the first direction I and the second direction II. The first opening OP1 may be formed to expose at least the second capping layers 543. Specifically, the first opening OP1 may be formed to have a size sufficiently large to expose at least some portions of the second capping layers 543 and sufficiently small to avoid exposing any portion of the memory cells 520A. The first opening OP1 may be formed to expose a partial thickness (e.g., a width in the first direction I) of the second capping layers 543 and the second liner layers 541. The first opening OP1 may be formed to expose the entire thickness of the second capping layers 543 and/or the second liner layers 541.

The first opening OP1 may be formed in a size or shape that does not expose the memory cell 520A. For example, when the size of the first opening OP1 is excessively large, the second liner layers 541 and/or the second capping layers 543 may be sufficiently exposed, so that the second liner layers 541 and/or the second capping layers 543 may be effectively removed in a subsequent process, but the memory cells 520A may be exposed or damaged. When the size of the first opening OP1 is excessively small, the second liner layers 541 and/or the second capping layers 543 may not be sufficiently removed in a subsequent process, so that an undesirable amount of heat may be transferred between the memory cells 520A adjacent in the second direction II. Accordingly, the first opening OP1 may be formed in a size that separates the second liner layers 541 and/or the second capping layers 543 while preventing damage to the memory cells 520A and minimizing transfer of heat between the memory cells 520A.

The first opening OP1 may have various shapes for securing a distance margin from the memory cell 320A. The first opening OP1 may have various shapes, such as a circular shape, an elliptical shape, or a polygonal shape. For example, the first opening OP1 may have a circular shape.

Figure 10A:
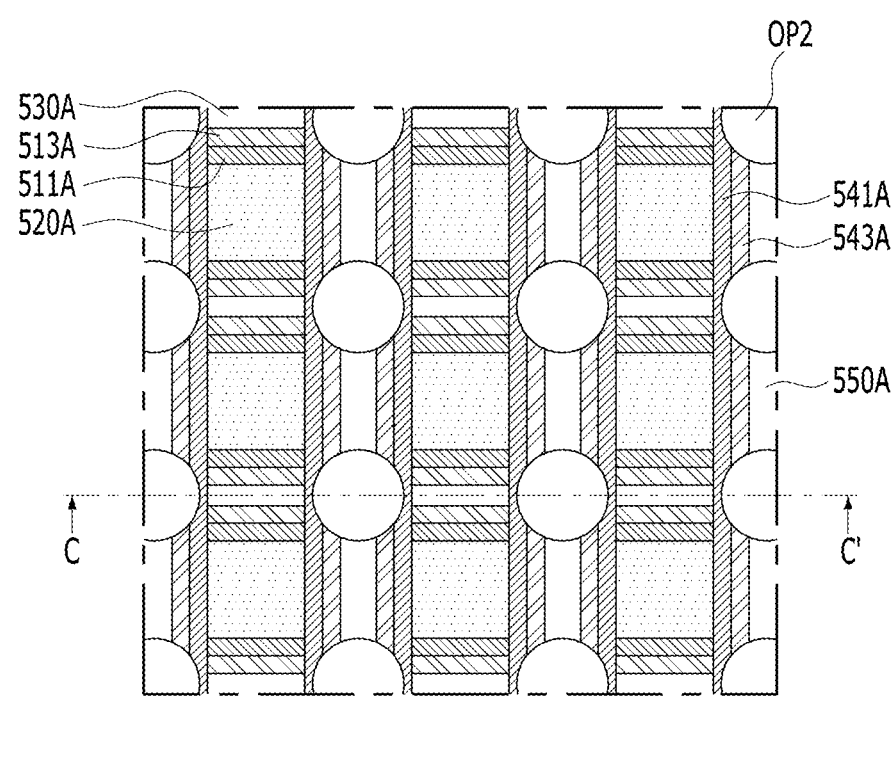
Figure 10B:
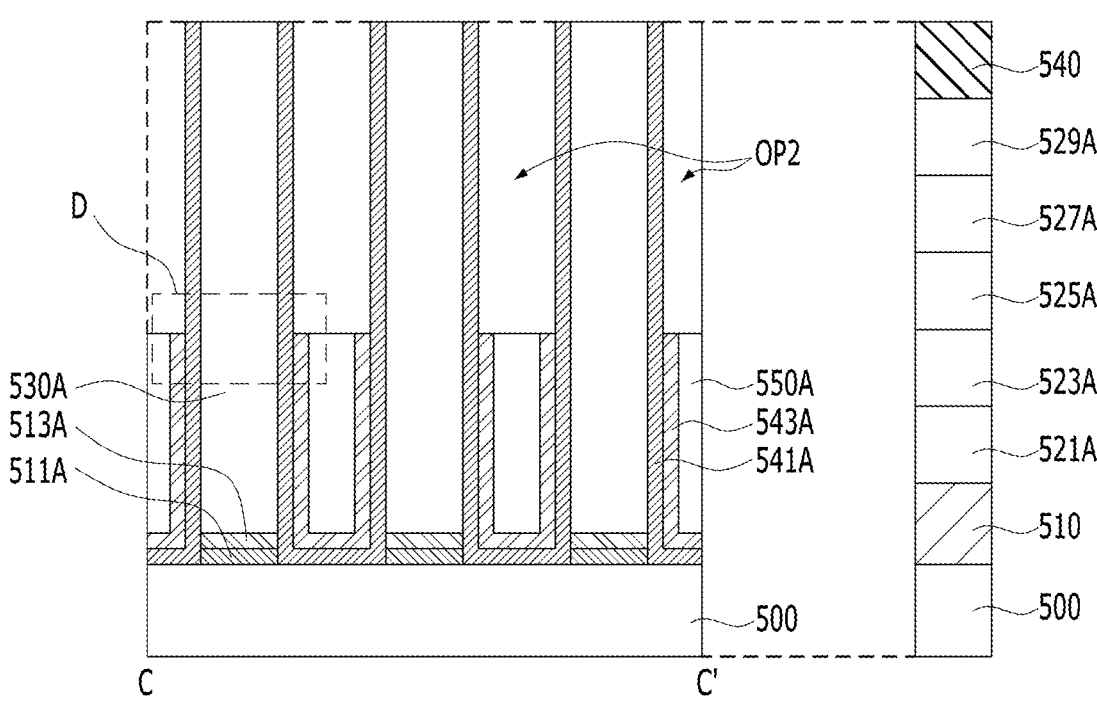
Figure 10C:
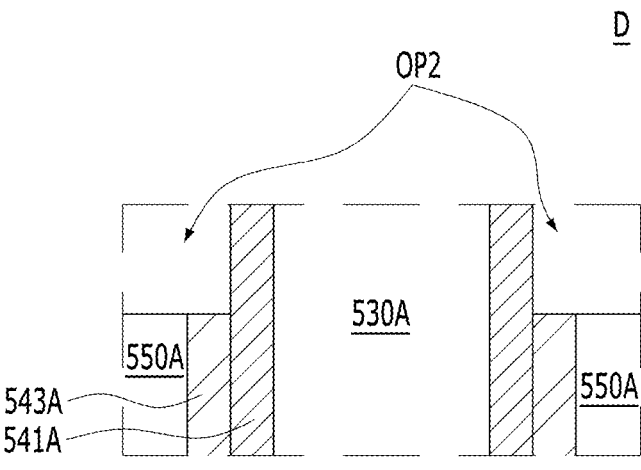

Referring to FIG. 10A and FIG. 10B, second openings OP2 may be formed. For example, the second openings OP2 may be formed by etching the second gap-fill layers 550, the second capping layers 543, or the second liner layers 541 using the hard mask pattern HM in FIG. 9A and FIG. 9B as an etch barrier.

The second gap-fill layers 550 may be separated into second gap-fill patterns 550A by the second opening OP2. The second liner layers 541 and the second capping layers 543 may also be separated into second liner patterns 541A and second capping patterns 543A by the second opening OP2, respectively. The sizes of the second openings OP2 may be substantially the same as or different from the sizes of the first openings OP1. For example, the second openings OP2 may be formed in a size that separates the second liner layers 541 and/or the second capping layer 543 into the second liner patterns 541A and/or the second capping patterns 543A, respectively, while preventing damage to the memory cells 520A and minimizing transfer of heat between the memory cells 520A.

The shapes of the second openings OP2 may be substantially the same as or different from those of the first openings OP1. For example, the second opening OP2 may have a circular shape, an elliptical shape, or a polygonal shape. In other words, the second opening OP2 may have various shapes that separates the second liner layers 541 and/or the second capping layer 543 into the second liner patterns 541A and/or the second capping patterns 543A, respectively, while securing a distance margin from the memory cell 520A. For example, when the second opening OP2 has a rhombus shape, a distance margin between the second opening OP2 and the memory cell 520A may be secured while the second liner layers 541 and/or the second capping layers 543 are sufficiently separated through the corner portion of the rhombus.

Figure 10D:
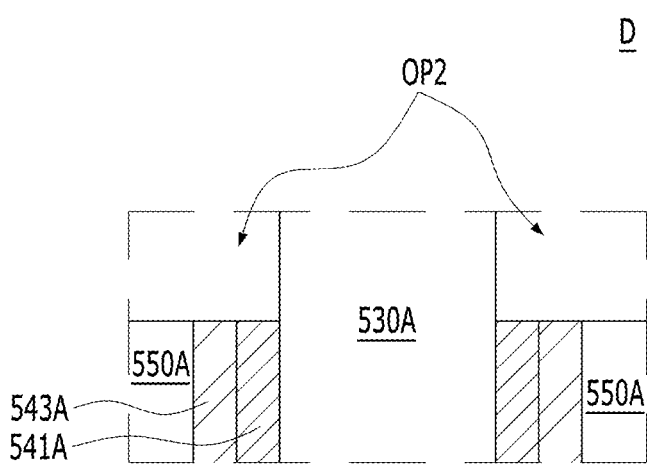

The second openings OP2 may be formed to a depth that exposes at least the variable resistance pattern 527A. The second openings OP2 may be formed to a depth that exposes the substrate 500. Referring to FIG. 10A and FIG. 10C, the second opening OP2 may be formed between the first gap-fill patterns 530A adjacent in the first direction I, and expose the second liner patterns 541A adjacent in the first direction I. Referring to FIG. 10A and FIG. 10D, the second opening OP2 may expose the first gap-fill pattern 530A.

Figure 11A:
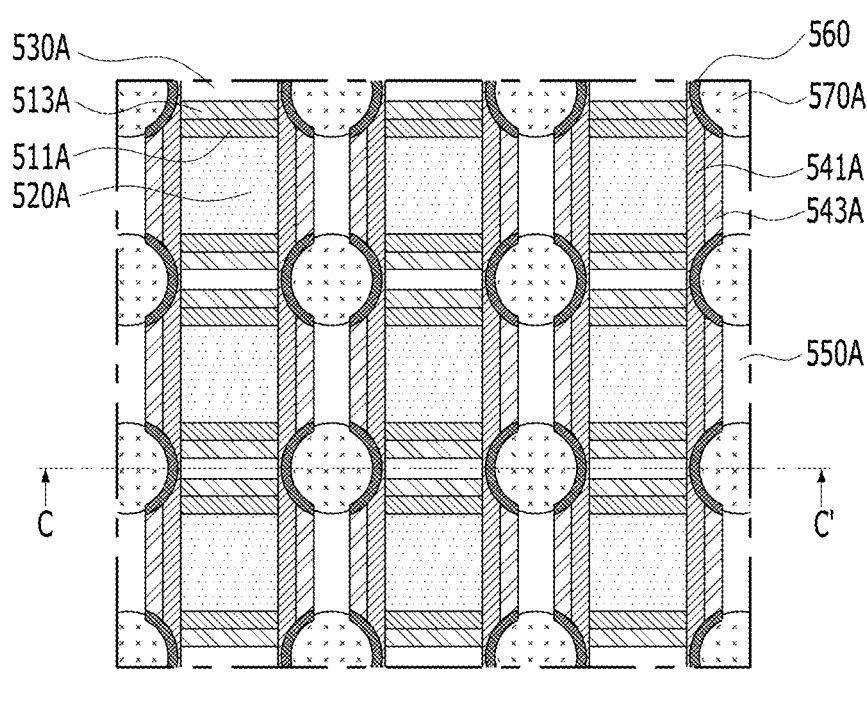
Figure 11A:
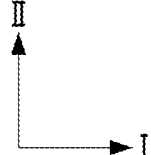
Figure 11B:
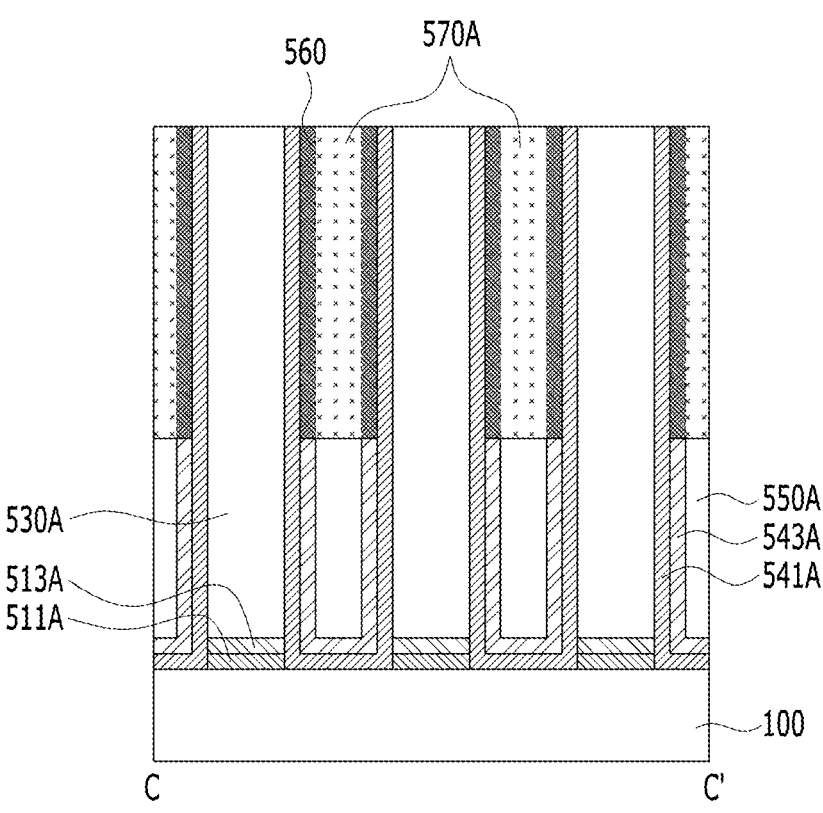

The second capping patterns 543A may be removed at a level corresponding to the level of the variable resistance pattern 527A by the second opening OP2 in the embodiment of FIG. 10C. The second liner patterns 541A and the second capping patterns 543A may be removed at a level corresponding to the level of the variable resistance pattern 527A by the second opening OP2 in the embodiment of FIG. 10D. Accordingly, the connection between the memory cells 520A adjacent in the second direction II is blocked by the second opening OP2, and transfer of heat between the memory cells 520A may be reduced. Referring to FIG. 11A and FIG. 11B, barrier layers 560 may be formed. The barrier layers 560 may be formed in the second openings OP2, respectively. The barrier layers 560 may be formed in the second liner patterns 541A and/or the second capping patterns 543A exposed by the second openings OP2, respectively. For example, when the second liner layers 541 and/or the second capping layers 543 remain in order to prevent damage to the memory cells 520A in the process of forming the second openings OP2, the barrier layers 560 may be formed.

The barrier layers 560 may be formed by oxidizing the second liner patterns 541A or the second capping patterns 543A. Specifically, after cutting the second liner layers 541, or the second capping layers 543, or both to expose remaining portions of the second liner layers 541 and/or the second capping layers 543 by the second openings OP2, the barrier layers 560 may be formed by oxidizing the remaining portions of the second liner layers 541 and/or the second capping layers 543. For example, the barrier layers 560 may be formed by heat-treating the second liner patterns 541A or the second capping patterns 543A in an atmosphere of oxygen ($O_2$). In such a case, the heat treatment process may be performed at 200° C. to 400° C. or about 300° C. As another example, the barrier layers 560 may be formed by treating the second liner patterns 541A and the second capping patterns 543A with oxygen ($O_2$) plasma. As another example, the barrier layers 560 may be formed through an ion implantation process.

The barrier layers 560 may each include a material having thermal conductivity substantially the same as or different from that of the second liner patterns 541A or the second capping patterns 543A. The barrier layers 560 may each include a material having lower thermal conductivity than the second liner patterns 541A or the second capping patterns 543A. The barrier layer 560 may include an insulating material such as oxide or nitride. For example, when the second liner patterns 541A, or the second capping patterns

543A, or both each include silicon nitride, the barrier layer 560 may be an oxide layer and may include a material having lower thermal conductivity than the second liner patterns 541A, or the second capping patterns 543A, or both.

Since the barrier layer 560 is formed in the second opening OP2, the shape of the second opening OP2 may be transferred. For example, when the second opening OP2 has a circular shape, the barrier layer 560 may also include a part of the circular shape. As another example, when the second opening OP2 has a rhombus shape, the barrier layer 560 may also include a part of rhombus shape.

Subsequently, a third gap-fill pattern 570A may be formed in the barrier layers 560. The third gap-fill pattern 570A may include silicon oxide, silicon oxycarbide, or the like.

When the second openings OP2 are formed to respectively separate the second liner layers 541 and the second capping layers 543 into the second liner patterns 541A and the second capping patterns 543A, the third gap-fill patterns 570A may be formed without forming the barrier layer 560.

According to the process described above, the second liner layers 541 and the second capping layers 543 connecting the memory cells 520A adjacent in the second direction II may be respectively separated into the second liner patterns 541A and the second capping patterns 543A by the second openings OP2. Furthermore, the second openings OP2 may be formed deeper than a position where the variable resistance pattern 527A of the memory cell 520A is formed.

Accordingly, it is possible to block, minimize, or reduce transfer of heat, which is generated in the variable resistance pattern 527A, between the memory cells 520A adjacent in the second direction II.

Furthermore, when the second liner layers 541 and/or the second capping layers 543 remain in order to prevent damage to the memory cells 520A during the manufacturing process, the barrier layer 56 may be additionally formed. In such a case, the barrier layer 560 may have lower thermal conductivity than the second liner layers 541, or the second capping layers 543, or both. Accordingly, it is possible to block, minimize, or reduce heat generated in the variable resistance pattern 527A by the barrier layer 560.

Although embodiments according to the technical idea of the present disclosure have been described above with reference to the accompanying drawings, this is only for explaining the embodiments according to the concept of the present disclosure, and embodiments of the present disclosure are not limited to the above embodiments. Various types of substitutions, modifications, and changes for the embodiments may be possible.

What is claimed is:

1. A semiconductor device comprising:
   memory cells arranged in a first direction and a second direction intersecting the first direction;
   first capping patterns spaced apart from each other in the second direction and covering first sidewalls of the memory cells;
   second capping patterns spaced apart from each other in the first direction and covering second sidewalls of the memory cells;
   first gap-fill patterns each located between the memory cells adjacent in the first direction;
   second gap-fill patterns each located between the first gap-fill patterns adjacent in the second direction; and
   barrier layers each located between the second capping patterns adjacent in the second direction, wherein each of the barrier layers extends along an outer wall of a corresponding one of the second gap-fill patterns and connects the second capping patterns adjacent in the second direction.

2. The semiconductor device of claim 1, wherein the second capping patterns cover the second sidewalls of the memory cells adjacent in the second direction, respectively, and are spaced apart from each other in the second direction.

3. The semiconductor device of claim 1, wherein the second gap-fill patterns each include a circular shape, an elliptical shape, or a polygonal shape.

4. The semiconductor device of claim 1, wherein the barrier layers each include a part of a circular shape, an elliptical shape, or a polygonal shape.

5. The semiconductor device of claim 4, wherein each of the barrier layers includes oxide, and
   wherein each of the second capping patterns includes nitride.

6. The semiconductor device of claim 1, further comprising:
   first liner patterns each located between the first sidewall of a corresponding one of the memory cells and a corresponding one of the first capping patterns;
   second liner patterns each located between the second sidewall of a corresponding one of the memory cells and a corresponding one of the second capping patterns.

7. The semiconductor device of claim 6, wherein the second liner patterns cover the second sidewalls of the memory cells adjacent in the second direction, and are spaced apart from each other in the second direction.

8. The semiconductor device of claim 6, wherein thermal conductivity of the barrier layers is lower than the second liner patterns, or the second capping patterns, or both.

9. The semiconductor device of claim 6, wherein each of the first liner patterns and the second liner patterns includes oxide, nitride, or silicon nitride.

10. The semiconductor device of claim 1, wherein each of the memory cells includes a variable resistance pattern, and
   wherein the variable resistance pattern includes chalcogenide.

11. The semiconductor device of claim 10, wherein bottom surfaces of the barrier layers are located below a bottom surface of the variable resistance pattern.

12. The semiconductor device of claim 1, wherein each of the first capping patterns and the second capping patterns includes oxide, nitride, or silicon nitride.

13. The semiconductor device of claim 1, wherein each of the first and second gap-fill patterns includes silicon oxide or silicon oxycarbide.

14. The semiconductor device of claim 1, wherein a combined structure of a corresponding one of the second gap-fill patterns and a corresponding one of the barrier layers has a size sufficiently large to separate at least the second capping patterns adjacent in the second direction and sufficiently small not to damage the memory cells adjacent to the second gap-fill pattern.

15. A semiconductor device comprising:
   memory cells arranged in a first direction and a second direction intersecting the first direction;
   first capping patterns spaced apart from each other in the second direction and covering first sidewalls of the memory cells;
   second capping patterns spaced apart from each other in the first direction and covering second sidewalls of the memory cells;
   first gap-fill patterns each located between the memory cells adjacent in the first direction;
   second gap-fill patterns each located between the first gap-fill patterns adjacent in the second direction;
   third gap-fill patterns each located between the memory cells adjacent in the second direction; and
   barrier layers each located between a corresponding one of the second gap-fill patterns and a corresponding one of the third gap-fill patterns.

16. The semiconductor device of claim 15, wherein each of the barrier layers has a shape corresponding to a portion of a circular shape, an elliptical shape, or a polygonal shape.

17. The semiconductor device of claim 15, further comprising:
   first liner patterns each located between the first sidewall of a corresponding one of the memory cells and a corresponding one of the first capping patterns; and
   second liner patterns each located between the second sidewall of a corresponding one of the memory cells and a corresponding one of the second capping patterns.

18. The semiconductor device of claim 17, wherein thermal conductivity of the barrier layers is lower than at least one of the first liner patterns, the second liner patterns, the first capping patterns, or the second capping patterns.

19. A semiconductor device comprising:
   memory cells arranged in a first direction and a second direction intersecting the first direction, wherein each of the memory cells includes a variable resistance pattern which includes chalcogenide;
   first capping patterns spaced apart from each other in the second direction and covering first sidewalls of the memory cells;
   second capping patterns spaced apart from each other in the first direction and covering second sidewalls of the memory cells;
   first gap-fill patterns each located between the memory cells adjacent in the first direction;
   second gap-fill patterns each located between the first gap-fill patterns adjacent in the second direction; and
   barrier layers each located between the second capping patterns adjacent in the second direction and a corresponding one of the second gap-fill patterns.

20. The semiconductor device of claim 19, wherein each of the first capping patterns covers the first sidewalls of a pair of the memory cells adjacent in the second direction, and each of the second capping patterns covers the second sidewalls of a pair of the memory cells adjacent in the first direction.

* * * * *